US012795888B2

(12) United States Patent
Sung et al.

(10) Patent No.: US 12,795,888 B2
(45) Date of Patent: Nov. 10, 2026

(54) FET DRAM WITH BACKSIDE BITLINE

(71) Applicant: International Business Machines Corporation, Armonk, NY (US)

(72) Inventors: Min Gyu Sung, Latham, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 1021 days.

(21) Appl. No.: 17/983,014

(22) Filed: Nov. 8, 2022

(65) Prior Publication Data

US 2024/0155826 A1 May 9, 2024

(51) Int. Cl.
*H10B 12/00* (2023.01)
*H10W 20/20* (2026.01)

(52) U.S. Cl.
CPC .......... *H10B 12/312* (2023.02); *H10B 12/36* (2023.02); *H10W 20/20* (2026.01)

(58) Field of Classification Search
CPC .... H10D 30/673; H10D 30/62; H10D 30/689; H10D 30/0323; H10D 30/6713; H10D 30/6744; H10D 30/6757; H10D 62/021; H10D 64/015; H10D 64/021; H10D 62/151; H10D 62/364; H10D 64/017; H10D 30/797; H10D 64/671; H10D 84/85; H10D 30/031; H10D 48/362; H10D 30/472; H10D 30/014; H10D 30/43; H10D 30/01; H10D 62/80; H10D 62/8303; H10D 62/882; H10D 99/00; H10D 62/118; H10D 62/121; H10D 62/235; H10D 89/10; H10D 84/0128; H10D 84/0167; H10D 84/038; H10D 84/853; H10D 62/292; H10D 64/691; H10D 30/6735; H10D 64/685; H10D 84/0144; H10D 84/0177; H10D 84/0181; H10D 89/601; H10D 84/834; H10D 30/6739; H10D 30/60–798; H10D 30/021–0415;

(Continued)

(56) References Cited

U.S. PATENT DOCUMENTS 7,387,931 B2 6/2008 Seo et al.
7,531,412 B2 5/2009 Yoon et al.

(Continued)

FOREIGN PATENT DOCUMENTS

CN 102881690 B 5/2016
CN 104143550 B 7/2019

(Continued)

OTHER PUBLICATIONS

International Search Report dated Jan. 22, 2024, received in a corresponding foreign application, namely International application No. PCT/CN2023/128963, 8 pages.

(Continued)

*Primary Examiner* — Moin M Rahman
(74) *Attorney, Agent, or Firm* — Scully, Scott, Murphy & Presser, P.C.; Kimberly Zillig

(57) ABSTRACT

A semiconductor structure is provided that includes a backside bitline connected to a dynamic random access memory (DRAM) cell that includes a plurality of field effect transistors (FETs) and a plurality of DRAM capacitors that are present in a frontside of the structure.

19 Claims, 15 Drawing Sheets

(58) Field of Classification Search
CPC ... H10D 84/83–859; H10D 62/85–854; H10D 30/751; H10D 30/027–0278; H10D 30/63; H10D 84/016; H10D 84/0195; H10D 30/501–509; H10D 84/0193; H10D 84/014; H10D 84/0158; H10D 86/215; H10D 30/6215; H10D 30/0217; H10D 30/024; H01L 21/31116; H01L 21/30604; H01L 21/3065; H01L 21/02068; H01L 21/32134; H01L 21/32136; H01L 21/32137; H01L 21/3213; H01L 21/0228; B82Y 10/00; H10B 12/312; H10B 12/36; H10B 63/34; H10W 20/20
See application file for complete search history.

(56) References Cited

U.S. PATENT DOCUMENTS

| | | | | |
|---|---|---|---|---|
| 7,564,084 | B2 | 7/2009 | Song et al. | |
| 7,615,817 | B2 | 11/2009 | Moon et al. | |
| 8,237,220 | B2 | 8/2012 | Sung et al. | |
| 10,714,490 | B1 | 7/2020 | Xiao | |
| 11,049,782 | B2 | 6/2021 | Lee et al. | |
| 11,094,714 | B2 | 8/2021 | Chen et al. | |
| 11,195,857 | B2 | 12/2021 | Kai et al. | |
| 11,295,985 | B2 | 4/2022 | Zhang et al. | |
| 2004/0061190 | A1* | 4/2004 | Yang | H10D 64/01354 257/412 |
| 2010/0237397 | A1* | 9/2010 | Uchiyama | H10B 12/053 257/306 |
| 2020/0235238 | A1 | 7/2020 | Lee et al. | |
| 2020/0243543 | A1 | 7/2020 | Pillarisetty et al. | |
| 2021/0357565 | A1 | 11/2021 | Fang et al. | |
| 2022/0068924 | A1* | 3/2022 | Tsai | H10B 12/33 |
| 2022/0102535 | A1 | 3/2022 | Wang et al. | |
| 2023/0062141 | A1* | 3/2023 | Zhu | H10B 12/00 |
| 2024/0040763 | A1* | 2/2024 | Liaw | H10B 10/125 |

FOREIGN PATENT DOCUMENTS

| | | | |
|---|---|---|---|
| CN | 111886692 | A | 11/2020 |
| CN | 113178444 | A | 7/2021 |
| CN | 114420180 | A | 4/2022 |
| CN | 119999350 | A | 5/2025 |
| DE | 112023003285 | T5 | 5/2025 |
| GB | 2638626 | A | 8/2025 |
| WO | 2020000289 | A1 | 1/2020 |
| WO | 2021163944 | A1 | 8/2021 |
| WO | 2024/099205 | A | 5/2024 |

OTHER PUBLICATIONS

Yoon, J.-M., et al., “A Novel Low Leakage Current VPT(Vertical Pillar Transistor) Integration”, 2006 64th Device Research Conference, Date of Conference: Jun. 26-28, 2006, 2 pages.

Boscke, T. S., “Crystalline Hafnia and Zirconia based Dielectrics for Memory Applications”, Jan. 2010, 14 pages https://cuvillier.de/de/shop/publications/763.

* cited by examiner

FET DRAM WITH BACKSIDE BITLINE

BACKGROUND

The present application relates to semiconductor technology, and more particularly to a semiconductor structure including a dynamic random access memory (DRAM) cell and a bitline connected to a backside of the DRAM cell.

Conventional vertical field effect transistors (VFETs) are devices where the source-drain current flows in a direction normal to the substrate surface. In such devices, a vertical semiconductor fin (or pillar) defines the channel with the source and drain located at opposing ends of the semiconductor fin (or pillar). VFETs are an attractive option for technology scaling for beyond 7 nm technologies, and have potential advantages over conventional FinFETs in terms of density, performance, power consumption and integration. For example, VFETs can be used as a component of a DRAM cell, especially for a DRAM cell having a $4F^2$ cell architecture.

SUMMARY

A semiconductor structure is provided that includes a backside bitline connected to a DRAM cell that includes a plurality of FETs and a plurality of DRAM capacitors that are present in a frontside of the structure. The backside bitline is an electrically conductive metal-containing material, thus the structure of the present application has a low bitline resistance that meets current performance specifications. In conventional DRAM cells having a $4F^2$ architecture, the bitline connected to the DRAM cell is a doped polysilicon layer that results in high bitline resistance, which does not meet current performance specifications.

In one aspect of the present application, a semiconductor structure is provided. In one embodiment of the present application, the semiconductor structure includes a DRAM cell including a plurality of FETs and a plurality of DRAM capacitors, and at least one bitline composed of an electrically conductive metal-containing material located on a backside of the DRAM cell. The term "backside" denotes a part of the structure including backside wiring components such as, for example, the bitline, that are located on a side of wafer not including the active devices, i.e., DRAM cell; the active devices are present on a frontside of the wafer, The structure of the present application has a low bitline capacitance as mentioned above.

In embodiments of the present application, the DRAM cell has a unit cell area defined as $4F^2$, wherein F is equal to a gate half pitch. In the present application, F denotes the feature size of the gate structure, and the gate pitch is determined by measuring the distance between one point of the gate structure to the same point of an adjacent gate structure. Thus, the DRAM cell of the present application has a high density.

In embodiments of the present application, each DRAM capacitor of the plurality of DRAM capacitors is a stacked capacitor. Stacked capacitors permit a means to scale the DRAM cell and to provide higher density in a smaller unit area.

In embodiments of the present application, the structure can further include a backside back-end-of-the-line (BEOL) structure contacting the at least one bitline, wherein the backside BEOL structure is a backside power distribution network that delivers power to the FETs.

In embodiments of the present application, each FET of the plurality of FETs is a vertical FET (VFET) including a vertical semiconductor channel material structure, a gate structure located on each side of the vertical semiconductor channel material structure, a first source/drain region located at a first end of the vertical semiconductor channel material structure and a second source/drain region located at a second end of the vertical semiconductor channel material structure, which is opposite the first end of the vertical semiconductor channel material structure. FETs that include a vertical semiconductor channel material structure allow for forming the $4F^2$ architecture mentioned above. In VFETs, the current flows in a vertical direction through the vertical semiconductor channel material structure.

In embodiments of the present application, the vertical semiconductor channel material structure, the first source/drain region and the second source/drain region are of unitary construction and are composed of a same semiconductor material. In other embodiments, the first and second source/drain regions are formed (e.g., by epitaxial growth) at opposing ends of the vertical semiconductor channel material structure.

In embodiments of the present application, the structure can further include a frontside source/drain contact structure contacting the first source/drain region, and connecting the first source/drain region to one of the DRAM capacitors of the plurality of DRAM capacitors.

In some embodiments of the present application, the at least one bitline is in direct contact with the second source/drain region. In other embodiments of the present application, the at least one bitline is in direct contact with a backside source/drain contact structure that is located on the second source/drain region.

In some embodiments of the present application, both the first source/drain region and the second source/drain region have a non-faceted surface, the non-faceted surface is opposite a surface of the first source/drain region and the second source/drain region that contacts the vertical semiconductor channel material structure.

In some embodiments of the present application, the structure can further include a dielectric spacer located along a sidewall of the first source/drain region.

In some embodiments of the present application, each DRAM capacitor of the plurality of DRAM capacitors is embedded in a frontside back-end-of-the-line (BEOL) structure. In such embodiments, the structure can further include a carrier wafer located on the frontside BEOL structure. In such embodiments, the carrier wafer is spaced apart from each DRAM capacitor of the plurality of DRAM capacitors by a portion of the frontside BEOL structure.

In some embodiments of the present application, each DRAM capacitor of the plurality of DRAM capacitors is present in a frontside interlayer dielectric material layer. In such embodiments, each DRAM capacitor extends entirely through the frontside interlayer dielectric material layer. In such embodiments, the structure can further include a carrier wafer located on the frontside interlayer dielectric material layer.

In some embodiments of the present application, each FET includes a gate structure located on each side of a vertical semiconductor channel material structure, wherein the gate structure includes a gate dielectric material layer in direct contact with a sidewall of the vertical semiconductor channel material structure, and a gate electrode located laterally adjacent to the gate dielectric material layer, wherein the gate electrode includes at least a work function metal layer. In such embodiments, a gate polysilicon layer can be positioned between the gate dielectric material layer and the gate electrode.

In some embodiments of the present application, the structure can further include a first dielectric spacer located on a surface of the gate structure and contacting the sidewall of the vertical semiconductor channel material structure, and a second dielectric spacer located on another surface of the gate structure and contacting the sidewall of the vertical semiconductor channel material structure.

In addition to providing a semiconductor structure, the present application also provides methods of forming the same. The methods of the present application which include both frontside and backside processing will be described in greater detail herein below.

DETAILED DESCRIPTION

Figure 1:
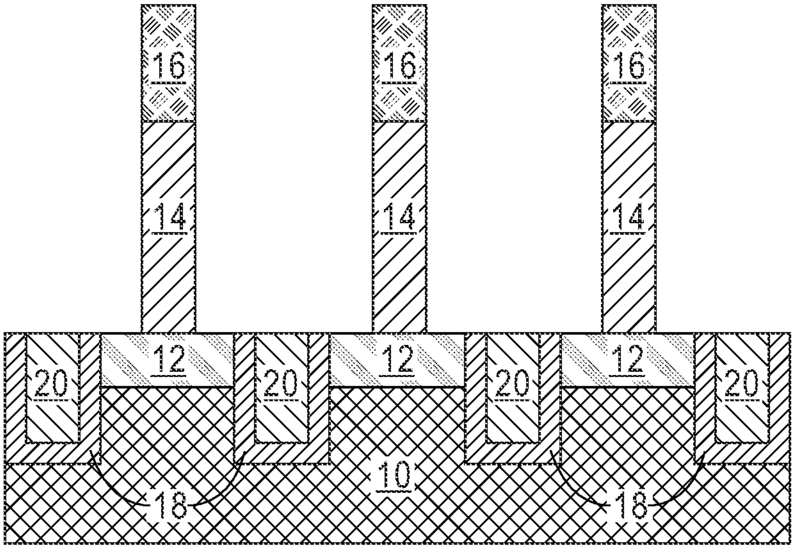
FIG. 1 is cross sectional view of an exemplary structure that can be employed in accordance with an embodiment of the present application, the exemplary structure including a plurality of vertical semiconductor channel material structures extending upward from a surface of an etch stop layer that is located on a surface of a base semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned above, an aspect of the present application relates to a semiconductor structure including a DRAM cell and a backside metal-containing bitline. Notably, the semiconductor structure includes a DRAM cell including a plurality of FETs and a plurality of DRAM capacitors, and at least one bitline composed of an electrically conductive metal-containing material located on a backside of the DRAM cell. As mentioned above, the term "backside" denotes a part of the structure including backside wiring components such as, for example, the bitline that are located on a side of the structure not including the active devices, i.e., DRAM cell. Such a structure has a low bitline capacitance as mentioned above. In embodiments of the present application, the DRAM cell has a unit cell area defined as $4F^2$, wherein F is equal to a gate half pitch. In the present application, F denotes the feature size of the gate structure. Thus, the DRAM cell of the present application has a high density. In embodiments, the FETs are vertical FETS including a vertical semiconductor channel material structure. VFETs aid in forming a $4F^2$ architecture. In embodiments, the DRAM capacitors are stacked capacitors which allows for a higher density cell. These and other aspects of the present application will now be described in greater detail.

Reference is first made to FIGS. 1-15 which illustrate a first embodiment of the present application. This first embodiment begins by forming the exemplary structure shown in FIG. 1. Notably, the exemplary structure shown in FIG. 1 includes a plurality of vertical semiconductor channel material structures 14 extending upward from a surface of an etch stop layer 12 that is located on a surface of a base semiconductor substrate 10. The exemplary structure shown in FIG. 1 can further include a hard mask cap 16 located on top of each vertical semiconductor channel material structure 14, and a shallow trench isolation structure 18/20 located in both the etch stop layer 12 and the base semiconductor substrate 10.

The base semiconductor substrate 10 is composed of a first semiconductor material having semiconducting properties. Examples of first semiconductor materials that can be used to provide the base semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors.

Each vertical semiconductor channel material structure 14 is composed of a second semiconductor material. The second semiconductor material that provides each vertical semiconductor channel material structure 14 can be compositionally the same as, or compositionally different from, the first semiconductor material that provides the base semiconductor substrate 10. In some embodiments, the second semiconductor material that provides each vertical semiconductor channel material structure 14 is capable of providing high channel mobility for nFET devices. In other embodiments, the second semiconductor material that provides each vertical semiconductor channel material structure 14 is capable of providing high channel mobility for pFET devices. Each vertical semiconductor channel material structure 14 will be used in the present application as a vertical channel structure, and in this first embodiment, source/drain regions will subsequently be formed on both horizontal surfaces of each vertical semiconductor channel material structure 14, and a gate structure will subsequently be formed along a sidewall of each vertical semiconductor channel material structure to form a plurality of VFETs.

In the present application, the vertical height of each vertical semiconductor channel material structure 14, as measured from a bottommost horizontal surface to a topmost horizontal surface, is greater than a width of each vertical semiconductor channel material structure 14, as measured from one sidewall of the vertical semiconductor channel material structure 14 to an opposing sidewall of the vertical semiconductor channel material structure 14. In one example, the vertical height of each vertical semiconductor channel material structure 14 is from 10 nm to 200 nm, while the width of each vertical semiconductor channel material structure 14 is from 5 nm to 50 nm In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the base semiconductor substrate 10 and the vertical semiconductor channel material structures 14. In one example, the base semiconductor substrate 10 is composed of silicon, the etch stop layer 12 is composed of silicon dioxide, and each vertical semiconductor channel material structure 14 is composed of silicon. In another example, the base semiconductor substrate 10 is composed of silicon, the etch stop layer 12 is composed of silicon germanium, and each vertical semiconductor channel material structure 14 is composed of silicon.

Each hard mask cap 16 can be composed of a dielectric hard mask material such as, for example, silicon nitride and/or silicon oxynitride. In the illustrated embodiment, each hard mask cap 16 has a sidewall that is vertically aligned to a sidewall of one of the vertical semiconductor channel material structures 14.

The shallow trench isolation structure 18/20 includes a trench liner 18 and a trench dielectric material 20. As is illustrated in FIG. 1, the trench liner 18 is present along a sidewall and a bottom wall of the trench dielectric material 20. The trench dielectric material 20 can be composed of any trench dielectric such as, for example, silicon oxide, while the trench liner 18 can be composed of any trench liner material such as, for example, silicon nitride. In some embodiments and as is illustrated in FIG. 1, the shallow trench isolation structure 18/20 extends entirely through the etch stop layer 12 and partially through the base semiconductor substrate 10. In some embodiments, the trench liner 18 can be omitted.

The exemplary structure shown in FIG. 1 can be prepared by first forming a substrate that includes base semiconductor substrate 10, etch stop layer 12, and a semiconductor material layer that is composed of the second semiconductor material mentioned above; this semiconductor material layer will be subsequently processed into vertical semiconductor channel material structures 14. The substrate can be formed utilizing techniques well known to those skilled in the art. A hard mask layer that is composed of a dielectric hard mask material as mentioned above is then formed on the semiconductor material layer. The hard mask layer can be formed utilizing a deposition process such as, for example, chemical vapor deposition (CVD), plasma enhanced chemical vapor deposition (PECVD), or physical vapor deposition (PVD). In some embodiments, the hard mask layer can be formed by a thermal process such as, for example, thermal oxidation and/or thermal nitridation. Next, the hard mask layer and the underlying semiconductor material layer are patterned to provide the hard mask capped vertical semiconductor channel material structures shown in FIG. 1.

In some embodiments, the patterning can include lithography and etching. Lithography includes forming a photoresist material on a material or a stack of materials that needs to be patterned, exposing the deposited photoresist material to a desired pattern of irradiation, and thereafter developing the exposed photoresist material. Etching can include a dry etching process and/or a chemical wet etching process. Dry etching can include one of reactive ion etching (RIE), plasma etching, or ion beam etching.

In some embodiments, the patterning can include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) can be composed of amorphous silicon or polysilicon. In another embodiment, the mandrel material layer (not shown) can be composed of a metal such as, for example, Al, W, or Cu. The mandrel material layer (not shown) can be formed, for example, by CVD or PECVD. Following deposition of the mandrel material layer (not shown), the mandrel material layer (not shown) can be patterned by lithography and etching to form a plurality of mandrel structures (also not shown) on the topmost surface of the structure. The SIT process continues by forming a spacer (not shown) on each sidewall of each mandrel structure. The spacer can be formed by deposition of a spacer material and then etching the deposited spacer material. The spacer material can comprise any material having an etch selectivity that differs from the mandrel material. Examples of deposition processes that can be used in providing the spacer material include, for example, CVD, PECVD, or atomic layer deposition (ALD). Examples of etching that can be used in providing the spacers include any etching process such as, for example, RIE. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet further embodiments, the patterning can include a direct self-assembly (DSA) process in which a copolymer that is capable of direct self-assembly is used. Other well-known patterning process can also be used in forming hard mask capped vertical semiconductor channel material structures shown in FIG. 1.

After forming the hard mask capped vertical semiconductor channel material structures shown in FIG. 1, the shallow trench isolation structure 18/20 is formed utilizing conventional shallow trench isolation processing as is well known to those skilled in the art. The shallow trench isolation processing can include forming a trench into the etch stop layer 12 and the base semiconductor substrate 10 by lithography and etching, and then filling the trench with a trench dielectric liner material and a trench dielectric as mentioned above; filling of the trench can include deposition of the trench dielectric liner material and the trench dielectric, and recessing those deposited materials.

Figure 2:
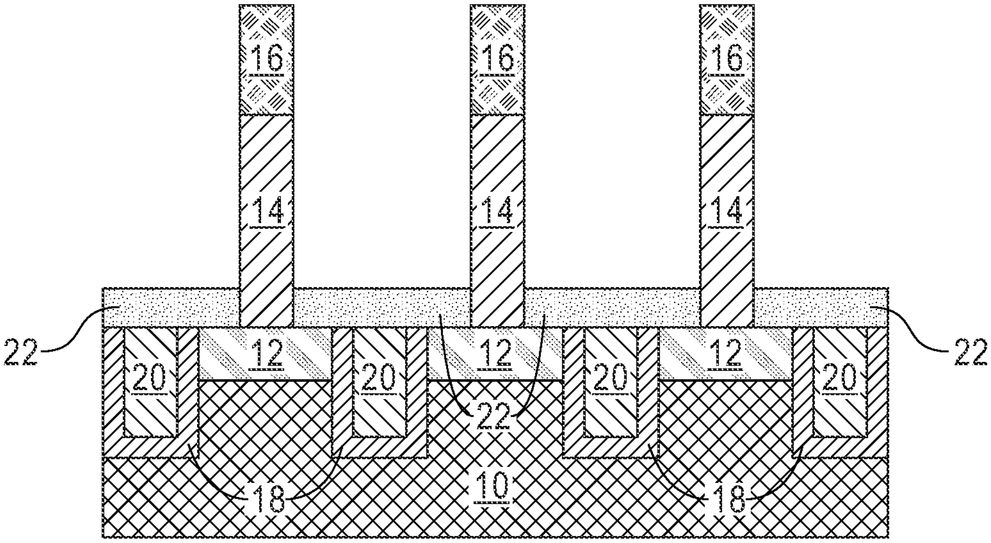
FIG. 2 is a cross sectional view of the exemplary structure shown in FIG. 1 after forming a first dielectric spacer, the first dielectric spacer contacting a lower portion of each vertical semiconductor channel material structure of the plurality of vertical semiconductor channel material structures.

Referring now to FIG. 2, there is illustrated the exemplary structure shown in FIG. 1 after forming a first dielectric spacer 22, the first dielectric spacer 22 contacting a lower portion of each vertical semiconductor channel material structure 14 of the plurality of vertical semiconductor channel material structures. In the present application, the first dielectric spacer 22 can be referred to as a bottom spacer. The first dielectric spacer 22 can be composed of any dielectric spacer material including, for example, silicon dioxide, silicon nitride, or silicon oxynitride. The first dielectric spacer 22 can be formed utilizing a deposition process such as, for example, CVD or PECVD. In some instances, an etch back process may follow the deposition of the dielectric spacer material that provides first dielectric spacer 22. The first dielectric spacer 22 can have a thickness from 5 nm to 15 nm. Other thicknesses that are lesser than, or greater than, the aforementioned thickness range can also be employed in the present application as the thickness of the first dielectric spacer 22 as long as the height of the first dielectric spacer 22 is not greater than the height of the vertical semiconductor channel material structures 14 and there is sufficient space along the sidewalls of the vertical semiconductor channel material structures 14 to form both a gate structure and a second dielectric spacer. The first dielectric spacer 22 is formed on top of both the shallow trench isolation structure 18/20 and the etch stop layer 12 as is shown in FIG. 2.

Figure 3:
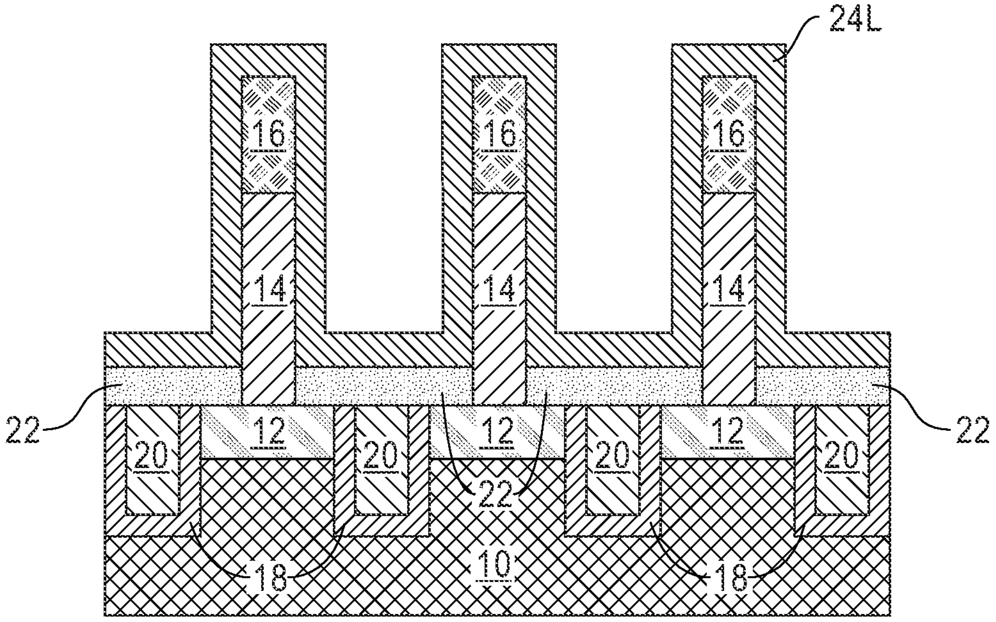
FIG. 3 is a cross sectional view of the exemplary structure shown in FIG. 2 after forming a gate structure material layer on the first dielectric spacer and along sidewalls and on top of each vertical semiconductor channel material structure.

Referring now to FIG. 3, there is illustrated is the exemplary structure shown in FIG. 2 after forming a gate structure material layer 24L on the first dielectric spacer 22 and along sidewalls and on top of each vertical semiconductor channel material structure 14; in the illustrated embodiment the gate structure material layer 24L is also present along the sidewalls and a topmost surface of the hard mask caps 16. The gate structure material layer 24L is typically a conformal layer. The term "conformal" denotes that a material layer has a vertical thickness along horizontal surfaces that is substantially the same (i.e., within ±5%) as the lateral thickness along vertical surfaces.

In the present application, the gate structure material layer 24L includes a gate dielectric material and a gate electrode, both of which are not separately, but intended to be within the gate structure material layer 24L. As is known to those skilled in the art, the gate dielectric material directly contacts the sidewalls of the vertical semiconductor channel material structures 14 and the gate electrode is formed on the gate dielectric material.

The gate dielectric material of the gate structure material layer 24L has a dielectric constant of 4.0 or greater. All dielectric constants mentioned herein are measured in a vacuum unless otherwise indicated. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg). The gate dielectric material can be formed utilizing any conformal deposition process such as, for example, CVD, PECVD or ALD.

The gate electrode of the gate structure material layer 24L can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate electrode can be formed by a deposition process such as, for example, CVD, PECVD, sputtering or plating.

Figure 4:
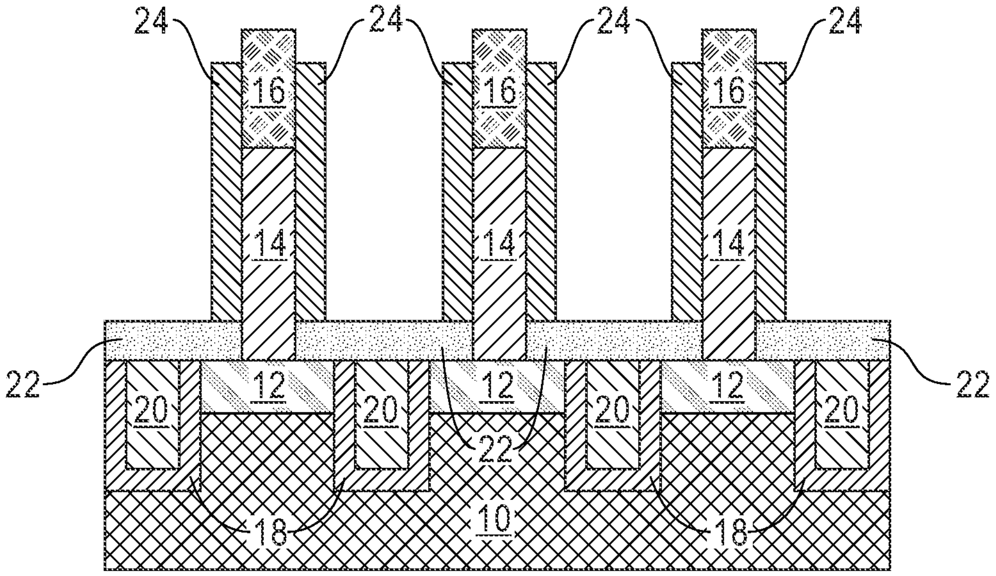
FIG. 4 is a cross sectional view of the exemplary structure shown in FIG. 3 after patterning the gate structure material layer to provide a gate structure along the sidewalls of each vertical semiconductor channel material structure of the plurality of vertical semiconductor channel material structures.

Referring now to FIG. 4, there is illustrated the exemplary structure shown in FIG. 3 after patterning the gate structure material layer 24L to provide a gate structure 24 along the sidewalls of each vertical semiconductor channel material structure 14 of the plurality of vertical semiconductor channel material structures; in the illustrated embodiment the gate structure 24 is also present along the sidewalls, but not the topmost surface, of the hard mask caps 16. The gate structure 24 includes unetched portions of the gate dielectric material and gate electrode, as mentioned above. The patterning includes the use of a gate pattern mask (not shown) that protects a portion of the gate structure material layer 24L, and etching. Etching can include dry etching such as RIE, or a chemical wet etch process. The gate structure 24 has a height that is less than the combined height of the hard mask capped vertical semiconductor channel material structures.

Figure 5:
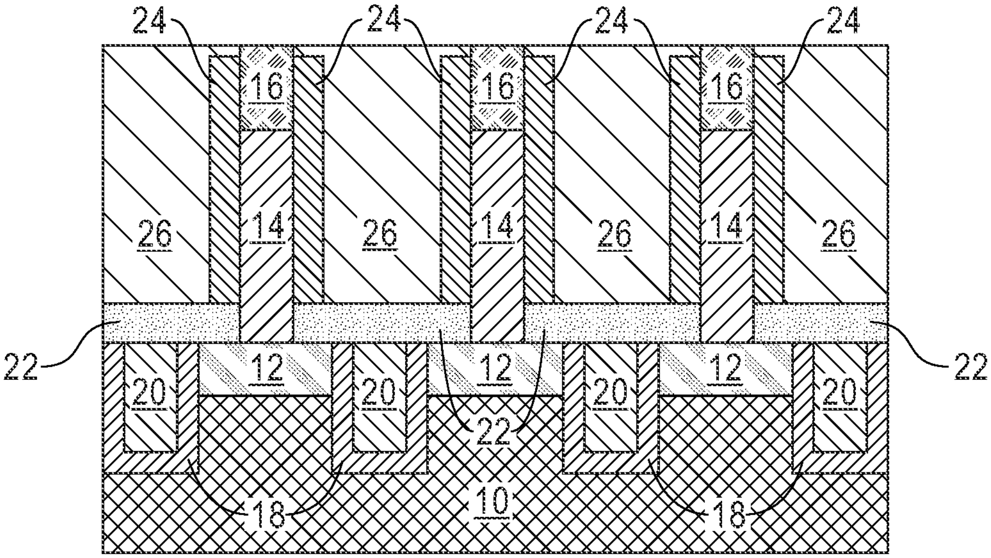
FIG. 5 is a cross sectional view of the exemplary structure shown in FIG. 4 after forming a first frontside interlayer dielectric (ILD) material layer laterally adjacent to each gate structure.

Referring now to FIG. 5, there is illustrated the exemplary structure shown in FIG. 4 after forming a first frontside interlayer dielectric (ILD) material layer 26 laterally adjacent to each gate structure 24. In the illustrated embodiment, the first frontside ILD material layer 26 has a topmost surface that is coplanar with a topmost surface of each hard mask cap 16; thus a portion of the first frontside ILD material layer 26 can be present on top of each gate structure 24. The first frontside ILD material layer 26 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. The first frontside ILD material layer 26 can be formed by deposition of the dielectric material, followed by a planarization process such as, for example, chemical mechanical polishing (CMP). The deposition of the dielectric material can include, for example, CVD, PECVD, ALD, or spin-on coating.

Figure 6:
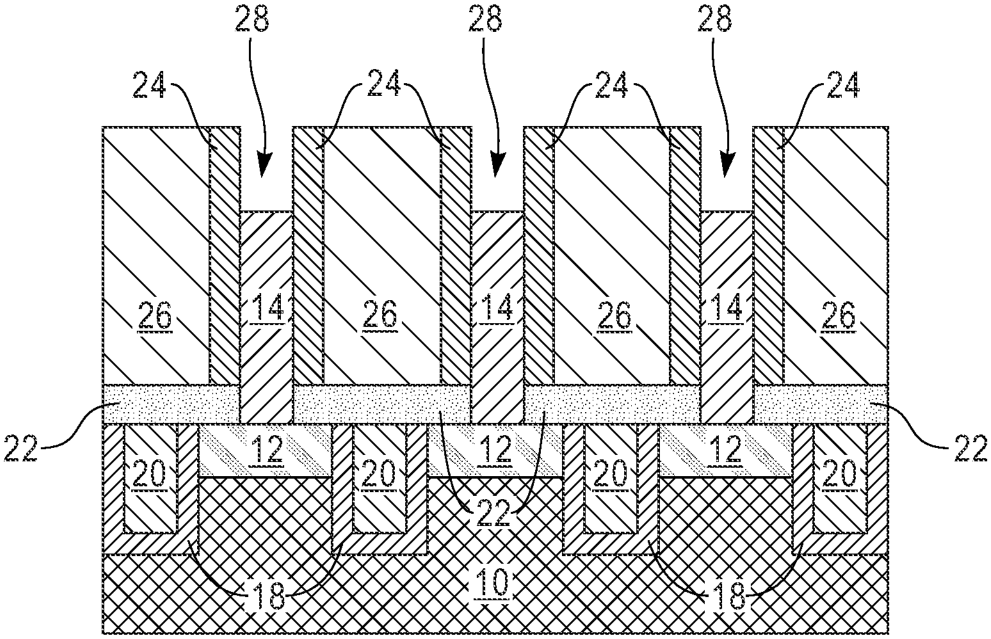
FIG. 6 is a cross sectional view of the exemplary structure shown in FIG. 5 after removing a hard mask cap that is present on top of each vertical semiconductor channel material structure of the plurality of vertical semiconductor channel material structures.

Referring now to FIG. 6, there is illustrated the exemplary structure shown in FIG. 5 after removing the hard mask cap 16 that is present on top of each vertical semiconductor channel material structure 14 of the plurality of vertical semiconductor channel material structures. The removal of the hard mask caps 16 from the exemplary structure includes an etching process that is selective in removing the hard mask material that provides each hard mask cap 16. After removing the hard mask caps 16 from the exemplary structure, a topmost surface of each vertical semiconductor channel material structure 14 is physically exposed and an opening 28 is formed above each vertical semiconductor channel material structure 14 as shown in FIG. 6.

Figure 7:
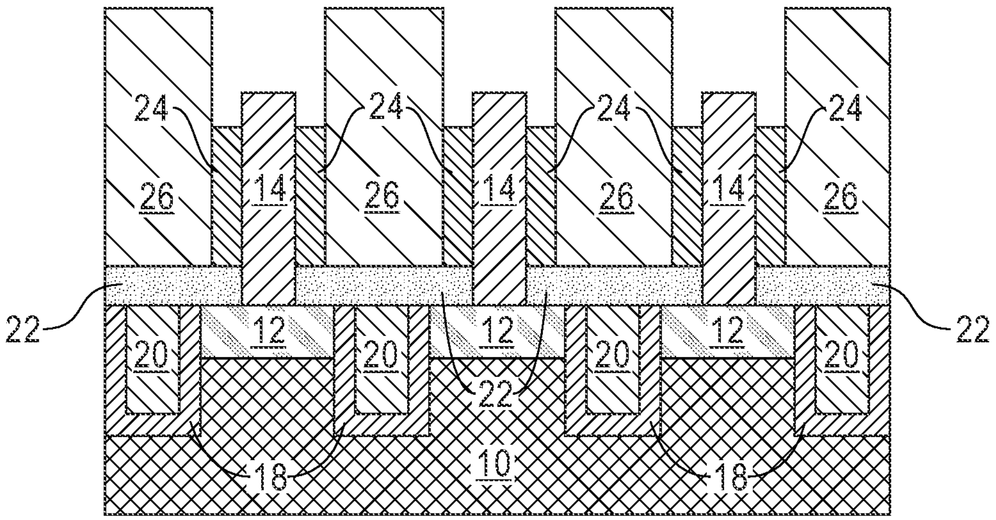
FIG. 7 is a cross sectional view of the exemplary structure shown in FIG. 6 after recessing each gate structure to physically expose an upper sidewall portion of each vertical semiconductor channel material structure of the plurality of vertical semiconductor channel material structures.

Referring now to FIG. 7, there is illustrated the exemplary structure shown in FIG. 6 after recessing each gate structure 24 to physically expose an upper sidewall portion of each vertical semiconductor channel material structure 14 of the plurality of vertical semiconductor channel material structures. The recessing of each gate structure 24 can be performed utilizing a recess etching process that is selective in remove a portion of each gate structure 24. This step of the present application provides a space along an upper sidewall portion of the vertical semiconductor channel material structure 14 in which a second dielectric spacer (or top dielectric spacer) will be subsequently formed. The recessed gate structure 24 now has a height that is less than a height of the vertical semiconductor channel material structure 14.

Figure 8:
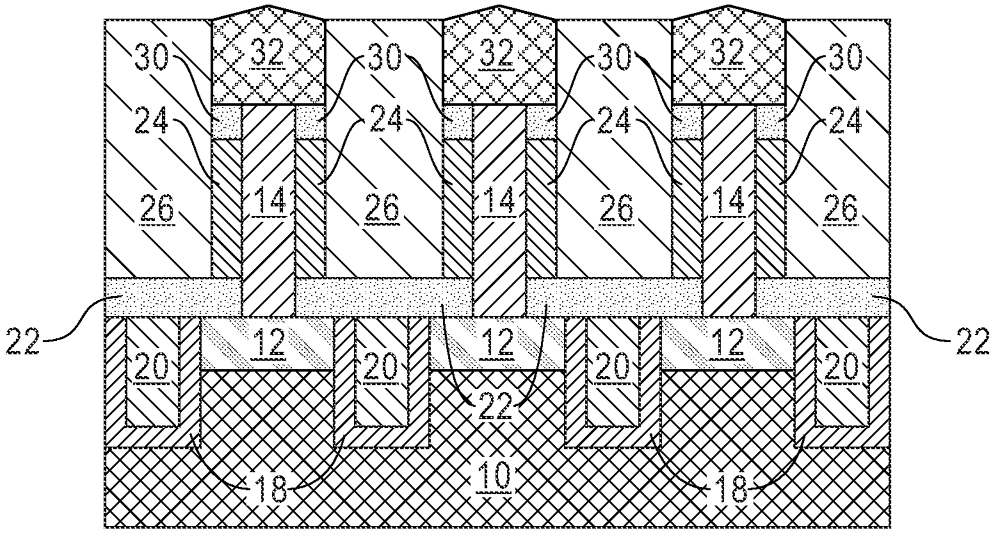
FIG. 8 is a cross sectional view of the exemplary structure shown in FIG. 7 after forming a second dielectric spacer laterally adjacent to the physically exposed upper sidewall portion of each vertical semiconductor channel material structure of the plurality of vertical semiconductor channel material structures, and forming a first source/drain region extending upward from a topmost surface of each vertical semiconductor channel material structure of the plurality of vertical semiconductor channel material structures.

Referring now to FIG. 8, there is illustrated the exemplary structure shown in FIG. 7 after forming second dielectric spacer 30 laterally adjacent to the physically exposed upper sidewall portion of each vertical semiconductor channel material structure 14 of the plurality of vertical semiconductor channel material structures, and forming a first source/drain region (or top source/drain region) 32 extending upward from a topmost surface of each vertical semiconductor channel material structure 14 of the plurality of vertical semiconductor channel material structures 14.

The second dielectric spacer 30 is composed of one of the dielectric spacer materials mentioned above for providing the first dielectric spacer 22. The second dielectric spacer 30 can be formed utilizing the process technique described above in forming the first dielectric spacer 22. The second dielectric spacer 30 can have a topmost surface that is coplanar with, or slightly offset from, the topmost surface of the vertical semiconductor channel material structures 14. When offset, the second dielectric spacer 30 has a topmost surface that is typically beneath a topmost surface of the vertical semiconductor channel material structures 14; such an embodiment would allow the first source/drain region 32 to also be formed along a sidewall of each vertical semiconductor channel material structure 14.

The first source/drain region 32 includes a semiconductor material and a dopant. The semiconductor material that provides the first source/drain region 32 includes one of the semiconductor materials mentioned above in providing the base semiconductor substrate 10. The semiconductor material that provides the first source/drain region 32 can be compositionally the same as, or compositionally different from, the second semiconductor material that provides each vertical semiconductor channel material structure 14. The dopant can be either an n-type dopant or a p-type dopant. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of the first dopant in the first source/drain region 32 can range from $1\times10^{18}$ atoms/$cm^3$ to $1\times10^{21}$ atoms/$cm^3$, although dopant concentrations greater than $1\times10^{21}$ atoms/$cm^3$ or less than $1\times10^{18}$ atoms/$cm^3$ are also conceived. The first source/drain region 32 can extend above the topmost surface of the first frontside ILD material layer 26 and the first source/drain region 32 can have a faceted or non-faceted surface. In FIG. 8, each first source/drain region 32 has a triangular surface that extends above the topmost surface of the first frontside ILD material layer 26. Note that the first source/drain region 32 are formed on the second dielectric spacer 30 and on physically exposed surfaces of the vertical semiconductor channel material structures 14. In this embodiment, both the first source/drain region 32 and the second source/drain region (to be subsequently formed) can have a non-faceted surface, the non-faceted surface is opposite a surface of the first source/drain region 32 and the second source/drain region (to be subsequently formed) that contacts the vertical semiconductor channel material structure 14.

The first source/drain region 32 can be formed utilizing a deposition process such as, for example, CVD, PECVD or epitaxial growth. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550 °C to 900 °C. Although higher temperature typically results in faster deposition, the faster deposition may result in crystal defects and film cracking. In embodiments, some embodiments, the dopant is added to an as deposited semiconductor material utilizing ion implantation or another like dopant introduction process. In yet other embodiments, the dopant is present during the deposition of the semiconductor material, e.g., an epitaxial growth process can be used in which the semiconductor material reactants and dopant are introduced at a same time.

Figure 9:
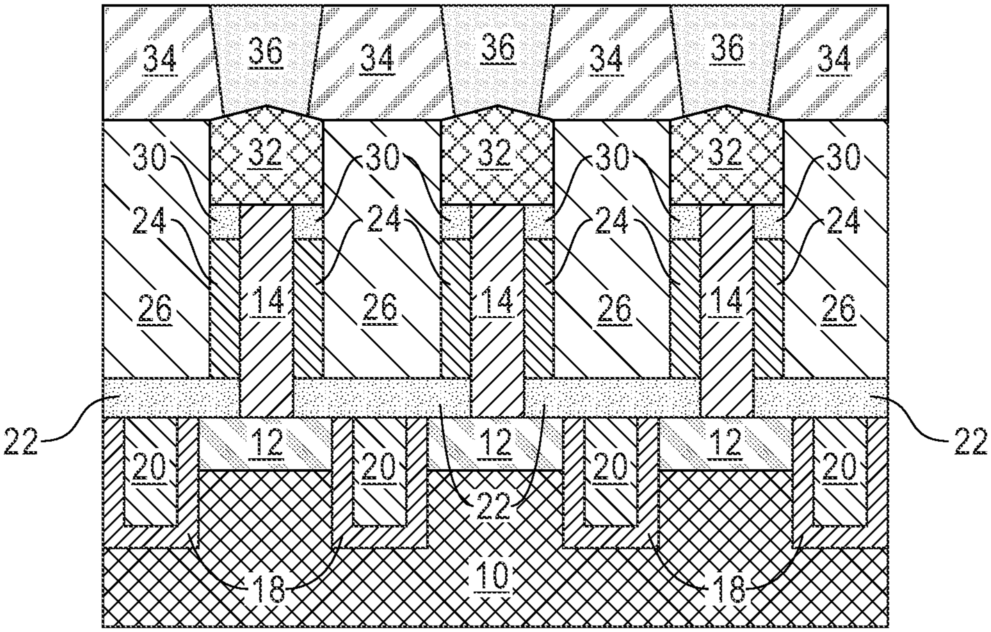
FIG. 9 is a cross sectional view of the exemplary structure shown in FIG. 8 after forming a second frontside ILD material layer having frontside contact structures embedded therein, each frontside contact structure contacting one of the first source/drain regions.

Referring now to FIG. 9, there is illustrated the exemplary structure shown in FIG. 8 after forming a second frontside ILD material layer 34 having frontside contact structures 36 embedded therein, each frontside contact structure 36 contacting one of the first source/drain regions 32. The second frontside ILD material layer 34 includes one of the dielectric materials mentioned above for the first frontside ILD material layer 26. The dielectric material that provides the second frontside ILD material layer 34 can be compositionally the same as, or compositionally different from, the dielectric material that provides the first frontside ILD material layer 26. The second frontside ILD material layer 34 can be formed utilizing one of the deposition processes mentioned above in forming the first frontside ILD material layer 26.

The frontside contact structures 36 are formed utilizing any conventional metallization process. Since each frontside contact structures 36 contacts a first source/drain region 32, the frontside contact structures 36 can be referred to as frontside source/drain contact structures. The frontside contact structures 36 include at least a contact conductor material such as, for example, W, Cu, Al, Co, Ru, Mo, Os, Ir, Rh or an alloy thereof. In embodiments, the frontside contact structures 36 can also include a silicide liner such as TiSi, NiSi, NiPtSi, etc., and an adhesion metal liner, such as TiN. Each frontside contact structure 36 can be formed by forming a contact opening in second frontside ILD material layer 34 by lithography and etching. The contact conductor material can be formed in the contact openings by any suitable deposition method such as, for example, ALD, CVD, PVD or plating. In some embodiments (not shown), a metal semiconductor alloy region can be formed in each of the contact openings prior to forming the contact conductor material. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, or PVD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions. Each frontside contact structure 36 can further include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed. Each frontside contact structures 36 has a topmost surface that is coplanar with a topmost surface of the second frontside ILD material layer 34.

Figure 10:
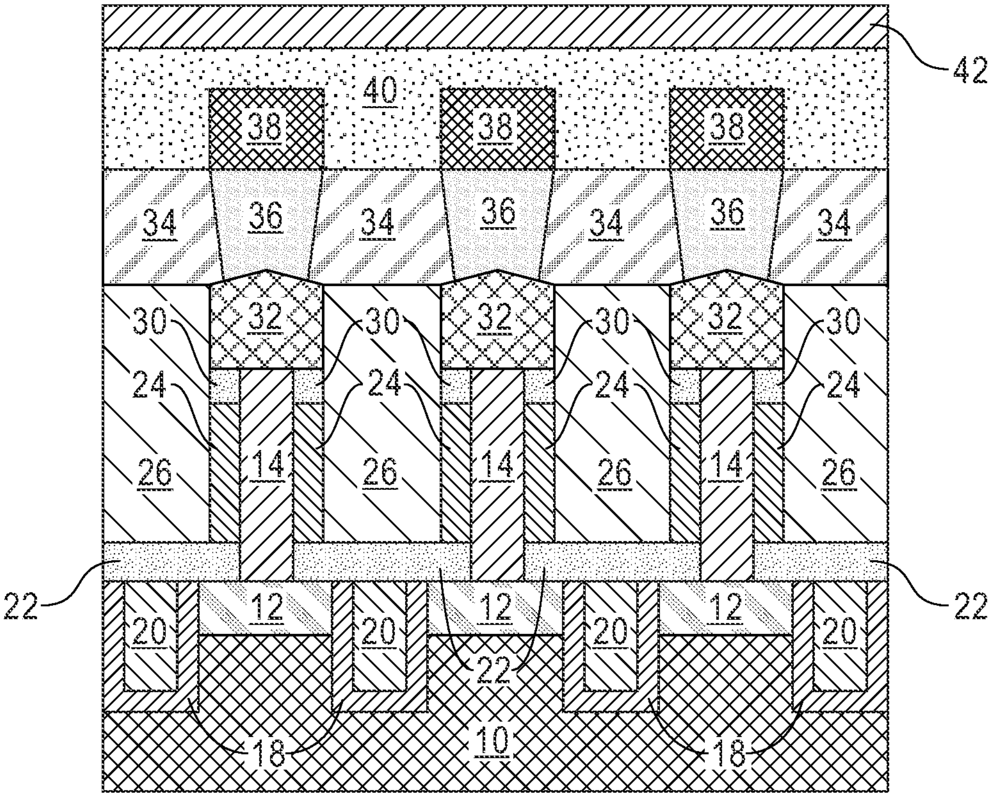
FIG. 10 is a cross sectional view of the exemplary structure shown in FIG. 9 after forming a frontside back-end-of-the-line (BEOL) structure having DRAM capacitors embedded therein, each DRAM capacitor contacting one of the frontside contact structures, and forming a carrier wafer on the frontside BEOL structure.

Referring now to FIG. 10, there is illustrated the exemplary structure shown in FIG. 9 after forming a frontside back-end-of-the-line (BEOL) structure 40 having DRAM capacitors 38 embedded therein, each DRAM capacitor 38 contacts one of the frontside contact structures 36, and forming a carrier wafer 42 on the frontside BEOL structure 40. As is shown in FIG. 10, each DRAM capacitor 36 is electrically connected to one of the first source/drain regions 32 by the frontside contact structure 36. Also, and as is further shown in FIG. 10, each DRAM capacitor 36 is spaced apart from the carrier wafer 42 by a portion of the frontside BEOL structure 40.

The frontside BEOL structure 40 includes one or more interconnect dielectric material layers that contain one or more wiring regions and the DRAM capacitors 38 embedded therein. The frontside BEOL structure 40 can be formed utilizing BEOL processing techniques that are well known to those skilled in the art; and the embedded DRAM capacitors 38 can be formed utilizing well known BEOL capacitor forming techniques that are also well known to those skilled in the art. The DRAM capacitors 38 include two conductive material plates (or electrodes) that are spaced apart by a dielectric material. The conductive material plates can be composed of any capacitor electrode material such as, for example, copper (Cu), tantalum (Ta), W, Al, ruthenium (Ru), rhodium (Rh), Co, molybdenum (Mo), titanium nitride (TiN) or tantalum nitride (TiN). The two conductive material plates can be composed of a compositionally same, or compositionally different, capacitor electrode material. The dielectric material that is located between the two conductive plates can include one of the dielectric materials mentioned above for the gate dielectric material of the gate structure material layer 24L. The DRAM capacitors 38 are typically a stacked capacitor including a bottom conductive plate and a top conductive plate that are spaced apart from each other by the dielectric material; thus the dielectric material is sandwiched between the bottom and top conductive plates. Such a stacked arrangement improves the density of the DRAM cell, The carrier wafer 42 can include one of the semiconductor materials mentioned above for the base semiconductor substrate 10. In the present application, the carrier wafer 42 is bonded to the frontside BEOL structure 40.

Figure 11:
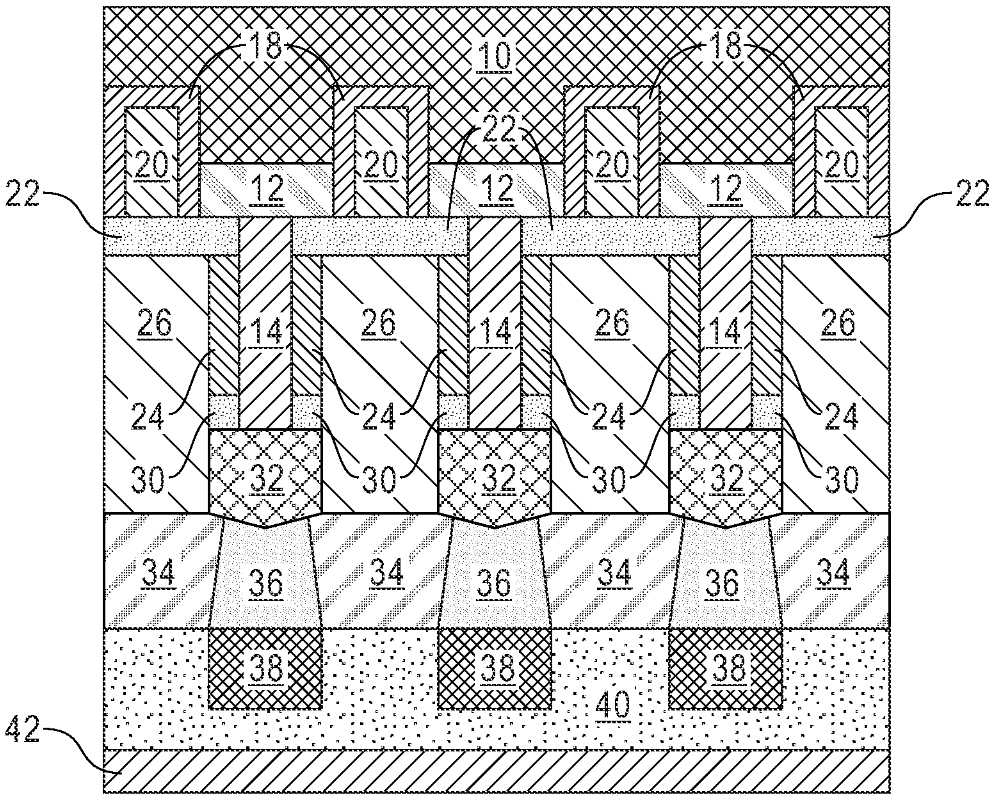
FIG. 11 is a cross sectional view of the exemplary structure shown in FIG. 10 after flipping the wafer 180° to physically expose a backside of the base semiconductor substrate.

Referring now to FIG. 11, there is illustrated the exemplary structure shown in FIG. 10 after flipping the wafer 180° to physically expose a backside of the base semiconductor substrate 10. This flipping will allow backside processing of the exemplary structure. In the present application, the structure is flipped 180°. Flipping of the structure can be performed by hand or by utilizing a mechanical means such as, for example, a robot arm.

Figure 12:
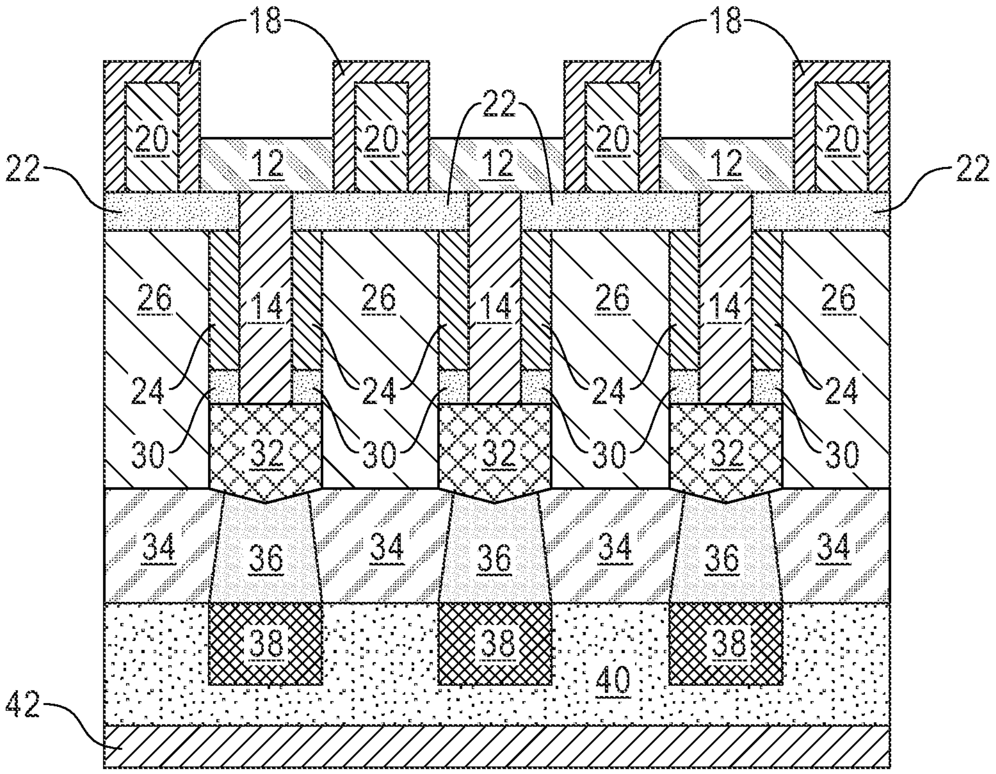
FIG. 12 is a cross sectional view of the exemplary structure shown in FIG. 11 after removing the base semiconductor substrate to physically expose the etch stop layer.

Referring now to FIG. 12, there is illustrated the exemplary structure shown in FIG. 11 after removing the base semiconductor substrate 10 to physically expose the etch stop layer 12. The removal of the base semiconductor substrate 10 can be performed utilizing a material removal process that is selective in removing the first semiconductor material that provides the base semiconductor substrate 10. Note that this removal step does not remove any portion of the shallow trench isolation structure 18/20.

Figure 13:
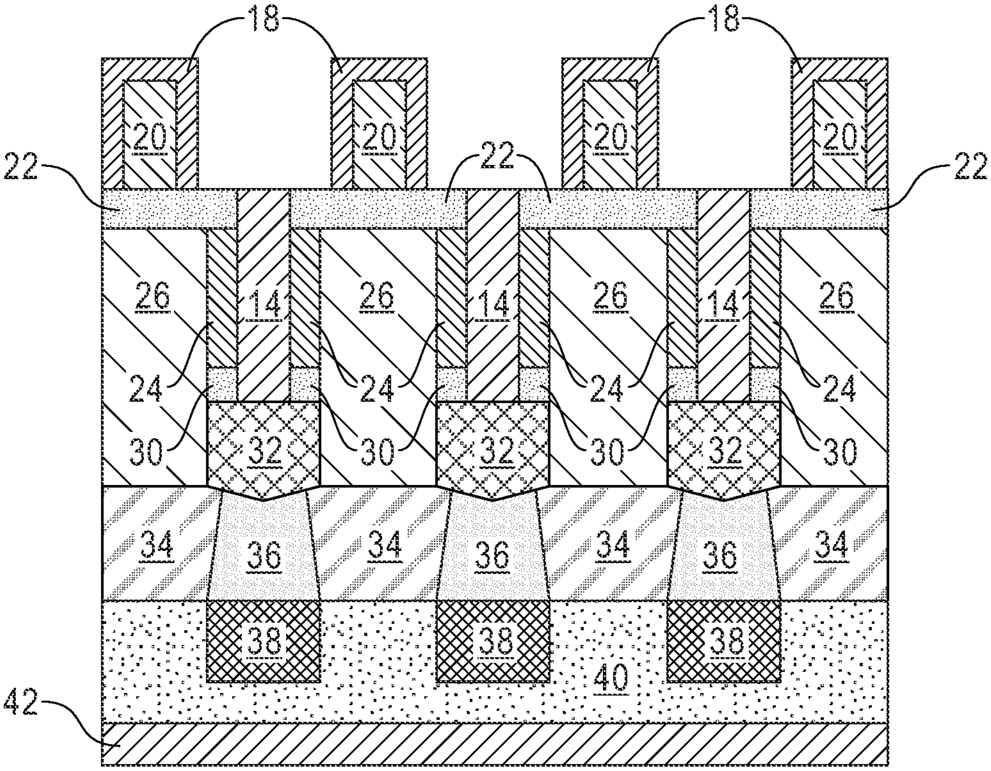
FIG. 13 is a cross sectional view of the exemplary structure shown in FIG. 12 after removing the etch stop layer to physically expose a horizontal surface of each vertical semiconductor channel material structure of the plurality of vertical semiconductor channel material structures.

Referring now to FIG. 13, there is illustrated the exemplary structure shown in FIG. 12 after removing the etch stop layer 12 to physically expose a horizontal surface of each vertical semiconductor channel material structure 14 of the plurality of vertical semiconductor channel material structures 14. Note that the physically exposed horizontal surface of the vertical semiconductor channel material structures 14 is opposite the horizontal surface of the vertical semiconductor channel material structure 14 that forms an interface with the first source/drain region 32. The removal of the etch stop layer 12 includes a material removal process that is selective in removing the etch stop layer 12.

Figure 14:
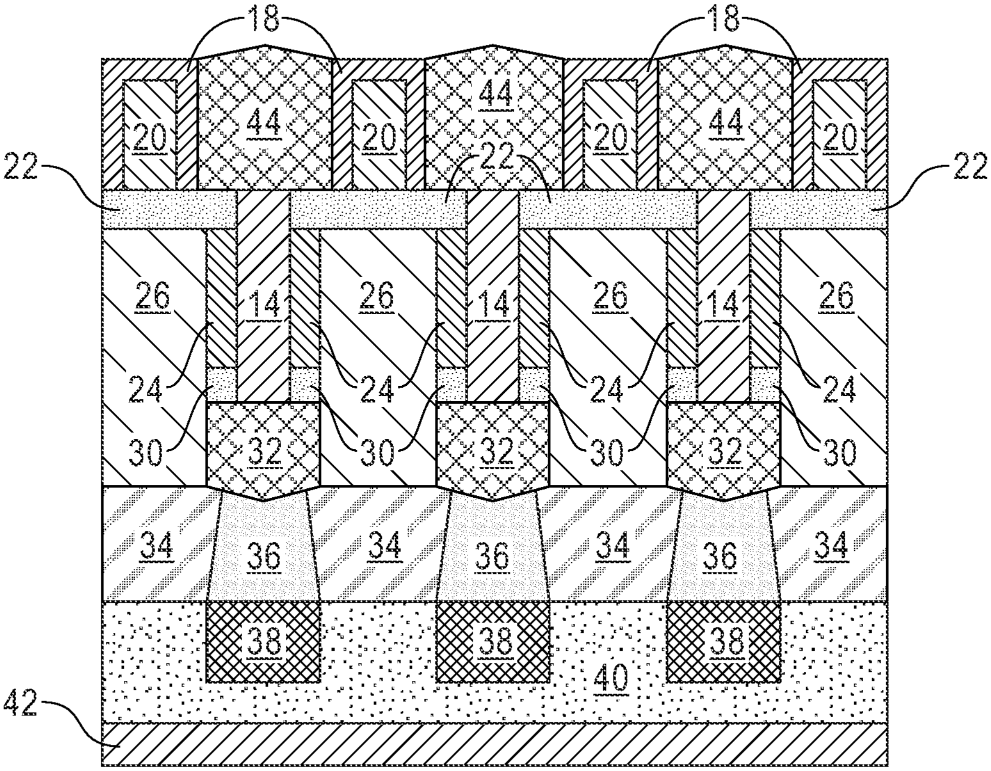
FIG. 14 is a cross sectional view of the exemplary structure shown in FIG. 13 after forming a second source/drain region on the physically exposed horizontal surface of each vertical semiconductor channel material structure of the plurality of vertical semiconductor channel material structures.

Referring now to FIG. 14, there is illustrated the exemplary structure shown in FIG. 13 after forming a second source/drain region 44 on the physically exposed horizontal surface of each vertical semiconductor channel material structure 14 of the plurality of vertical semiconductor channel material structures 14. Each second source/drain region 44 is flanked on either side by a shallow trench isolation structure 18/20. Each second source/drain region 44 can be referred to herein as a bottom source/drain region.

The second source/drain region 44 is composed of a semiconductor material and a dopant as mentioned above for the first source/drain region 32. The semiconductor material that provides the second source/drain region 44 can be compositionally the same as, or compositionally different from, the semiconductor material that provides the first source/drain region 32 and/or the second semiconductor material that provides the vertical semiconductor channel material structures 14. The dopant within the second source/drain region 44 is of the same conductivity type as the dopant present in the first source/drain region 32. The dopant concentration within the second source/drain region 44 is within the range mentioned above for the first source/drain region 32. Each second source/drain region 44 can have a faceted or a non-faceted surface, and each second source/drain region 44 can extend above a height of each shallow trench isolation structure 18, 20 as is illustrated in FIG. 14. In FIG. 14, each second source/drain region 44 has a triangular surface. The second source/drain regions 44 can be formed utilizing one of the techniques mentioned above in forming the first source/drain regions 32.

Figure 15:
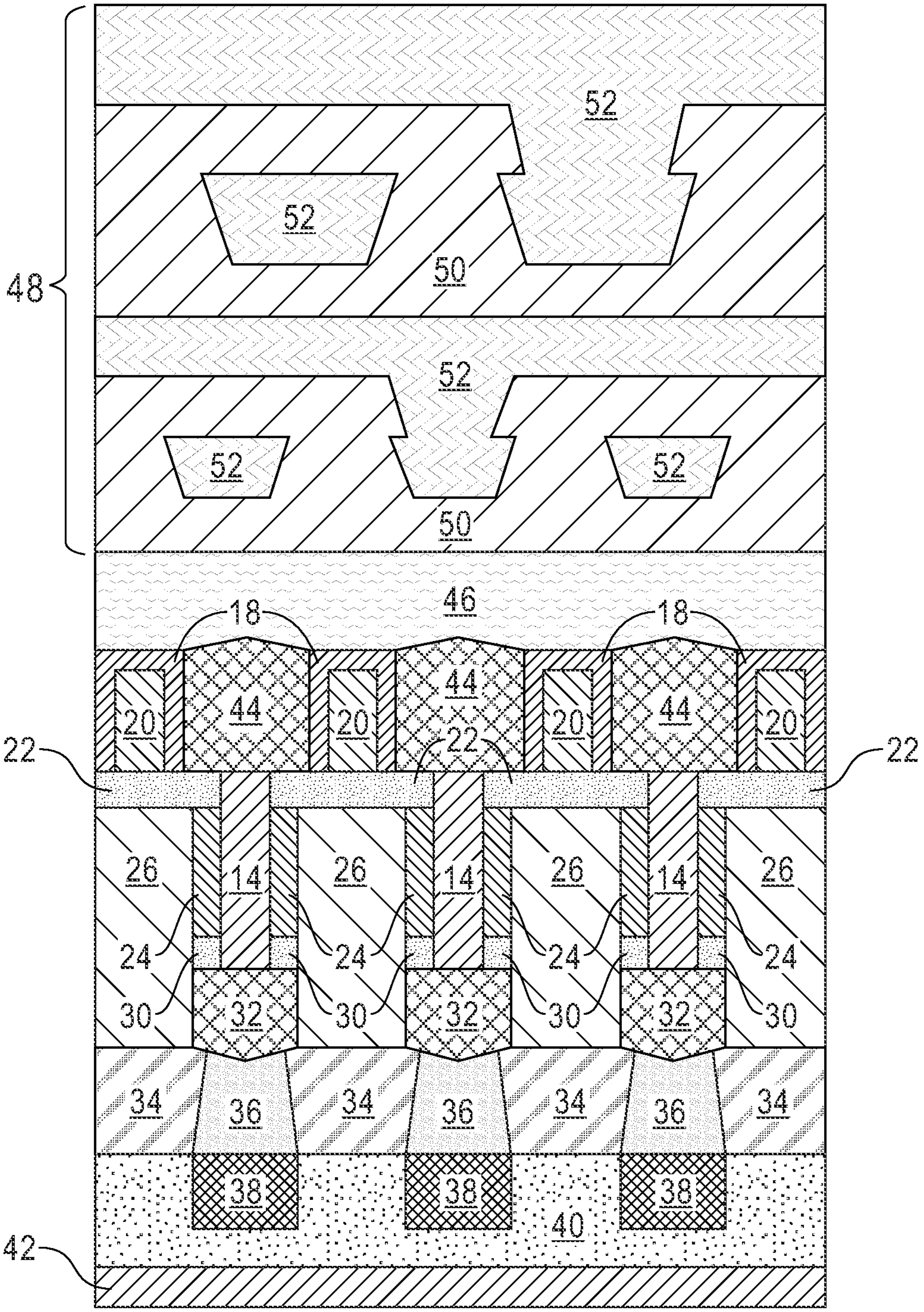
FIG. 15 is a cross sectional view of the exemplary structure shown in FIG. 14 after forming a backside bitline contacting each second source/drain region, and forming a backside BEOL structure on the backside bitline.

Referring now to FIG. 15, there is illustrated the exemplary structure shown in FIG. 14 after forming a backside bitline 46 contacting each second source/drain region 44, and forming a backside BEOL structure 48 on the backside bitline 46. In some embodiments (not shown), a backside source/drain contact (see the second embodiment of the present application) can be formed on the second source/drain region 44 prior to forming the backside bitline 46. Although a single backside bitline 46 is shown, the present application contemplates forming a plurality of such backside bitlines 46; in FIG. 15, for example, backside bitlines 46 would be present out and into the plane of the drawing sheet. The backside bitline 46 is composed of any electrically conductive metal-containing material including, but not limited to, W, Co, Ru, Al, Cu, platinum (Pt), Rh, or palladium (Pd), with a thin metal adhesion layer (such as TiN, TaN) typically being formed prior to the conductive metal deposition; for clarity, the metal adhesion layer is not separately illustrated in the drawings of the present application. The backside bitline 46 is typically embedded in a backside ILD material layer (not shown in the cross sectional view) and it can be formed by forming a backside bitline opening in the backside ILD material layer; the backside bitline opening physically exposes a surface of second source/drain regions 44. The backside bitline opening is then filled with at least one of the electrically conductive materials mentioned above, and a planarization process can follow the filling of the backside bitline opening. The filling can include a CVD, PECVD, ALD, sputtering or plating. The resultant backside bitline 46 is in contact with the second source/drain region 44 of each VFET. Each VFET includes vertical semiconductor channel material structure 14, gate structure 24 located on each side of the vertical semiconductor channel material structure 14, and the first source/drain region 32 located at a first end of the vertical semiconductor channel material structure 14 and the second source/drain region 44 that is located at a second end, which is opposite the first end, of the vertical semiconductor channel material structure 14. The first source/drain region 32 of each VFET is electrically connected to the DRAM capacitor 38 present in the frontside BEOL structure 40 by one of the frontside contact structures 36. In the present application, current flows vertically in the vertical semiconductor channel material structures 14 of each VFET. In the present application, the DRAM capacitor 38 and the VFETs collectively provide a DRAM cell; the DRAM capacitors serves as a storage node of the DRAM cell. The DRAM cell is typically a $4F^2$ cell as mentioned above.

The backside BEOL structure 48 can be a backside power distribution network that delivers power to the VFETs. The backside BEOL structure 48 includes one or more interconnect dielectric material layers (represented as element 50 in FIG. 15) that contain one or more wiring regions (represented by element 52 in FIG. 15). The backside BEOL structure 48 can be formed utilizing techniques that are well-known to those skilled in the art.

Reference is now made to FIGS. 16-35 which illustrate a second embodiment of the present application. This second embodiment begins by forming the exemplary structure shown in FIG. 16. Notably, the exemplary structure shown in FIG. 16 includes a base semiconductor substrate 10, an etch stop layer 12 located on the base semiconductor substrate 10 and a semiconductor material layer 14L having a plurality of an upper mesa portions 14U located on the etch stop layer 12. The exemplary structure of this embodiment of the present application can also include a hard mask cap 16 located on top of each upper mesa portion 14U of the semiconductor material layer 14L.

The base semiconductor substrate 10, the etch stop layer 12 and the hard mask caps 16 are the same as defined above in the first embodiment of the present application. The semiconductor material layer 14L having the plurality of upper mesa portions 14U is composed of the second semiconductor material that was mentioned above in providing the vertical semiconductor channel material structures 14 of the first embodiment of the present application.

Figure 16:
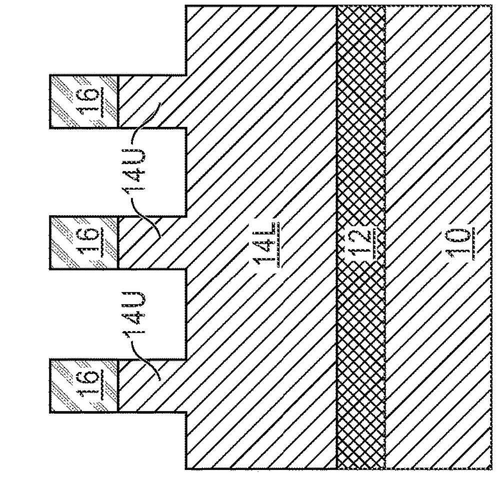
FIG. 16 is a cross sectional view of an exemplary structure that can be employed in another embodiment of the present application, the exemplary structure including a base semiconductor substrate, an etch stop layer located on the base semiconductor substrate and a semiconductor material layer having a plurality of upper mesa portions located on the etch stop layer.

The exemplary structure shown in FIG. 16 can be prepared by first forming a substrate that includes base semiconductor substrate 10, etch stop layer 12, and semiconductor material layer 14L that is composed of the second semiconductor material mentioned above. The substrate can be formed utilizing techniques well known to those skilled in the art. For example, the preparing of the substrate can include epitaxial growth of the etch stop layer 12 and the semiconductor material layer 14L. A hard mask layer that is composed of a dielectric hard mask material as mentioned above is then formed on the semiconductor material layer. The hard mask layer can be formed utilizing a deposition process or a thermal process, as mentioned above. Next, the hard mask layer and the underlying semiconductor material layer 14L are patterned to provide the structure shown in FIG. 16. In this embodiment, the patterning typically includes lithography and etching. The etch, which can include a dry etching process and/chemical wet etching process, etches entirely through the hard mask layer and partially through the semiconductor material layer 14L so as to provide the structure illustrated in FIG. 16. The term “mesa portion” is used herein to describe a portion of the material having a width that is greater than a width of base material.

Figure 17:
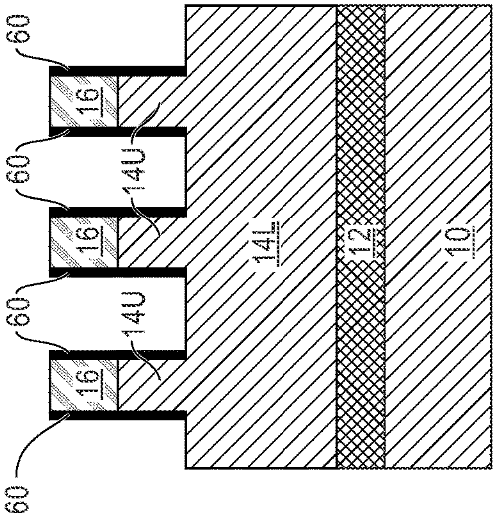
FIG. 17 is a cross sectional view of the exemplary structure shown in FIG. 16 after forming a dielectric spacer along a sidewall of at least each upper mesa portion of the semiconductor material layer.

Referring now to FIG. 17, there is illustrated the exemplary structure shown in FIG. 16 after forming a dielectric spacer 60 along a sidewall of at least each upper mesa portion 14U of the semiconductor material layer 14L; the dielectric spacer 60 is also present along the sidewalls of each hard mask cap 16 and the dielectric spacer 60 typically has a topmost surface that is coplanar with the hard mask cap 16. Dielectric spacer 60 is composed of any dielectric spacer material including the dielectric spacer materials mentioned above in forming the first dielectric spacer 22. Dielectric spacer 60 can be formed by deposition of a dielectric spacer material, followed by a spacer etch.

Figure 18:
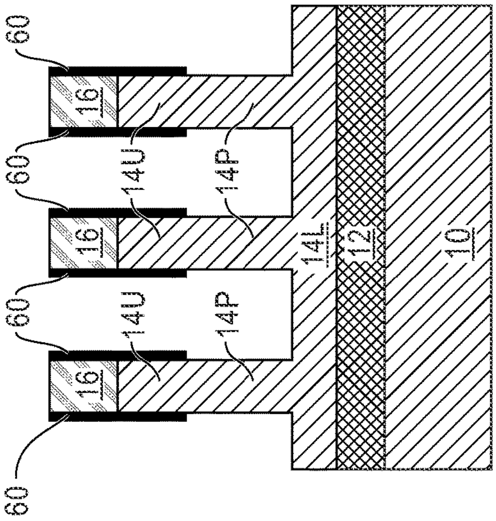
FIG. 18 is a cross sectional view of the exemplary structure shown in FIG. 17 after patterning the semiconductor material layer utilizing the dielectric spacer and the upper mesa portion of the semiconductor material layer as a combined etch mask, wherein the patterning forms a plurality of semiconductor material pillars on a remaining portion of the semiconductor material layer.

Referring now to FIG. 18, there is illustrated the exemplary structure shown in FIG. 17 after patterning the semiconductor material layer 14L utilizing the dielectric spacer 60 and the upper mesa portion 14U of the semiconductor material layer 14L as a combined etch mask, wherein the patterning forms a plurality of semiconductor material pillars 14P on a remaining portion of the semiconductor material layer 14L; upper mesa portion 14U is located on top of each semiconductor material pillar 14P. The patterning includes an etch that is selective in removing the second semiconductor material that provides the semiconductor material layer 14L. This etch stops on a sub-surface of the semiconductor material layer 14L as is shown in FIG. 18. Note that each semiconductor material pillar 14P can have a width that is substantially equal (±10%) to a width of the overlying upper mesa portion 14U.

Figure 19:
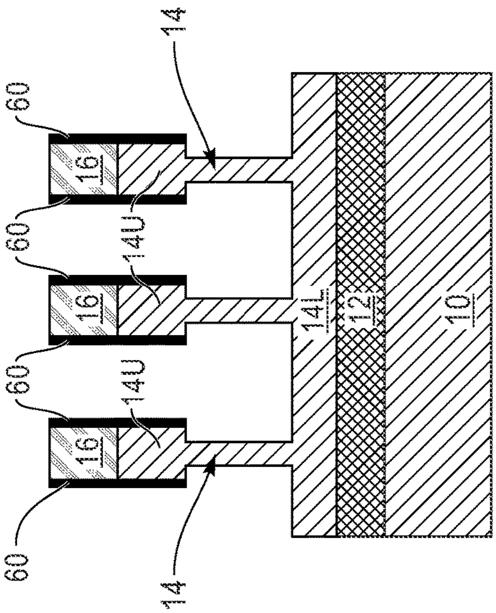
FIG. 19 is a cross sectional view of the exemplary structure shown in FIG. 18 after trimming each semiconductor material pillar to provide vertical semiconductor material channel structures, each vertical semiconductor material channel structure is located between an upper mesa portion of the semiconductor material layer and a remaining portion of the semiconductor material layer.

Referring now to FIG. 19, there is illustrated the exemplary structure shown in FIG. 18 after trimming each semiconductor material pillar 14P to provide vertical semiconductor material channel structures 14, each vertical semiconductor material channel structure 14 is located between the upper mesa portion 14U of the semiconductor material layer 14L and a remaining portion of the semiconductor material layer 14L. In some embodiments, the trimming of the semiconductor material pillars 14P can be performed utilizing a combination of oxidation and etching (this steps can be repeated numerous times to provide a desired width to each vertical semiconductor material channel structures 14). In other embodiments, this trimming can be performed by a dry etching process.

Figure 20:
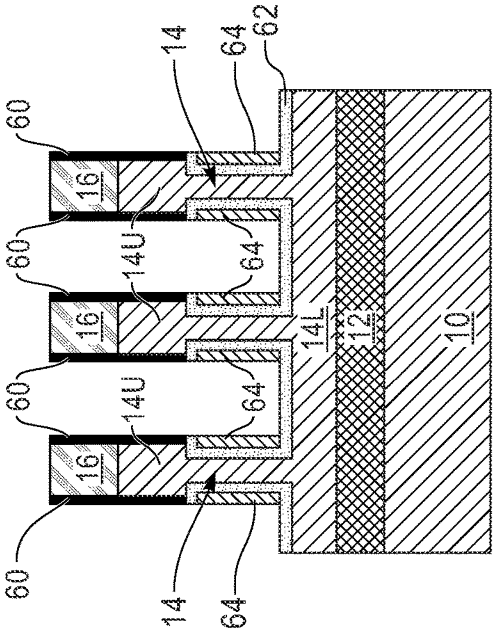
FIG. 20 is a cross sectional view of the exemplary structure shown in FIG. 19 after forming a gate dielectric material layer and a gate polysilicon layer.

Referring now to FIG. 20, there is illustrated the exemplary structure shown in FIG. 19 after forming a gate dielectric material layer 62 and a gate polysilicon layer 64. The gate dielectric material layer 62 includes one of the gate dielectric materials mentioned above for the gate structure material layer 24L in the previous embodiment of the present application. The gate polysilicon layer 64 is composed of polysilicon which can have an n-type or p-type dopant present therein. The gate dielectric material layer 62 and the gate polysilicon layer 64 are formed by first depositing (e.g., CVD, PECVD, or ALD) a dielectric material, second depositing (e.g., CVD, PECVD or PVD) polysilicon, and then an etch is used to remove any polysilicon that extends beyond the outermost surface of the dielectric spacer 60. The gate dielectric material layer 62 is a conformal layer that is present on exposed surfaces of each vertical semiconductor material channel structure 14 and the remaining semiconductor material layer 14L and the gate polysilicon layer 64 is located on the gate dielectric material layer 62.

Figure 21:
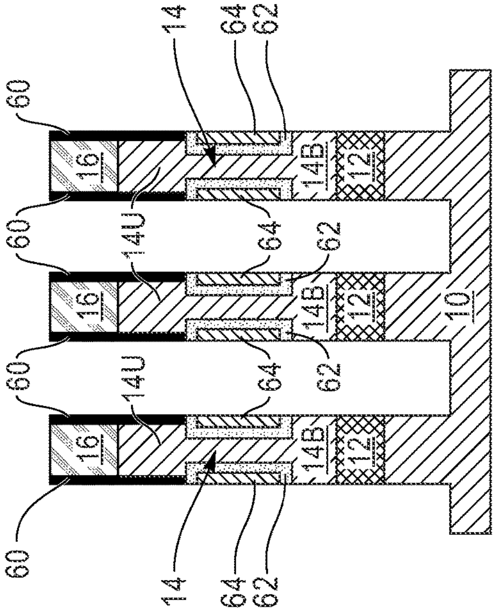
FIG. 21 is a cross sectional view of the exemplary structure shown in FIG. 20 after performing a breakthrough etching process that removes the gate dielectric material layer, the remaining portion of the semiconductor material layer, the etch stop layer and a portion of the base semiconductor substrate; the remaining semiconductor material layer that is not etched and that is protected by the combined etch mask provides a bottom mesa portion of the semiconductor material layer.

Referring now to FIG. 21, there is illustrated the exemplary structure shown in FIG. 20 after performing a breakthrough etching process that removes at least a portion of the gate dielectric material layer 62, the remaining portion of the semiconductor material layer 14L, the etch stop layer 12 and a portion of the base semiconductor substrate 10; the remaining semiconductor material layer that is not etched and that is protected by the combined etch mask provides a bottom mesa portion 14B of the semiconductor material layer 14L. Note that in addition to a portion of the semiconductor material layer 14L remaining after this etch, a portion of the etch stop layer 12 and a portion of the base semiconductor substrate 10 also remain after this breakthrough etch has been performed. In one embodiment, the breakthrough etch is a RIE etch.

Figure 22:
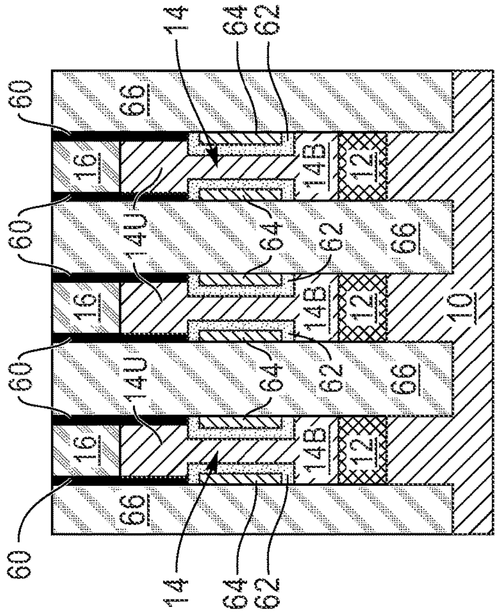
FIG. 22 is a cross sectional view of the exemplary structure shown in FIG. 21 after forming a gap fill dielectric material layer.

Referring now to FIG. 22, there is illustrated the exemplary structure shown in FIG. 21 after forming a gap fill dielectric material layer 66. Gap fill dielectric material layer 66 is composed of any gap fill dielectric material including, for example, one of the dielectric materials mentioned above for the first frontside ILD material layer 26 of the first embodiment of the present application. The gap fill dielectric material layer 66 can be formed by utilizing a deposition process including one of the deposition processes mentioned above in forming the first frontside ILD material layer 26 of the first embodiment of the present application. A planarization process can follow the deposition of the dielectric material that provides the gap fill dielectric material layer 66. At this junction of the present application, the gap fill dielectric material layer 66 has a topmost surface that is coplanar with a topmost surface of dielectric spacer 60 and a topmost surface of the hard mask caps 16.

Figure 23:
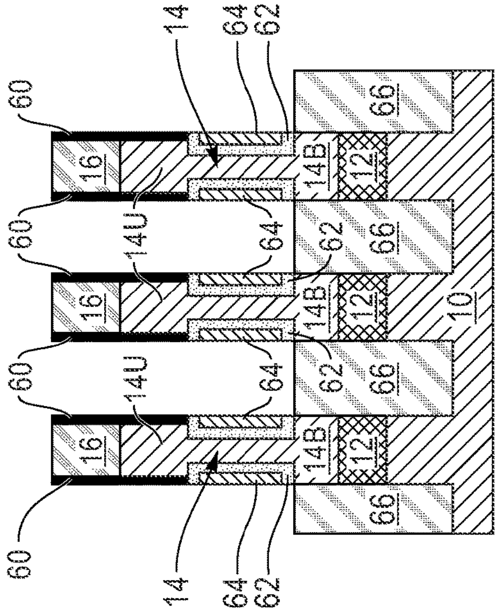
FIG. 23 is a cross sectional view of the exemplary structure shown in FIG. 22 after recessing the gap fill dielectric material layer.

Referring now to FIG. 23, there is illustrated the exemplary structure shown in FIG. 22 after recessing the gap fill dielectric material layer 66. The recessed gap fill dielectric material layer 66 has a topmost surface that is typically, but not necessarily always, coplanar with a topmost surface of the bottom mesa portion 14B of the semiconductor material layer 14L. The recessing of the gap fill dielectric material layer 66 can be performed utilizing a recessing etching process that is selective in removing the dielectric material that provides the gap fill dielectric material layer 66.

Figure 24:
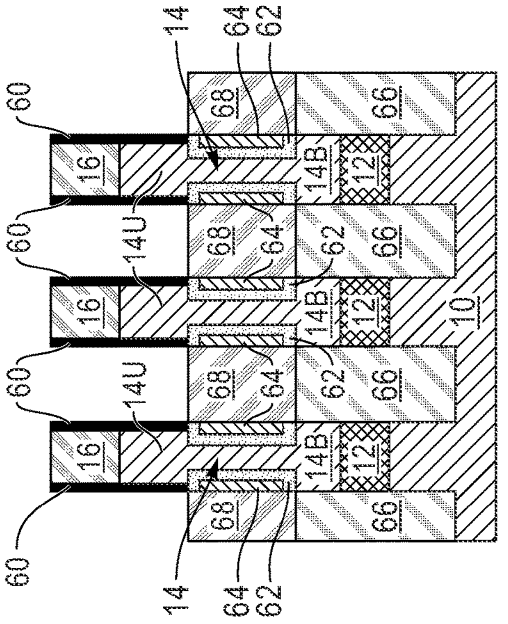
FIG. 24 is a cross sectional view of the exemplary structure shown in FIG. 23 after forming a gate metal layer on the recessed gap fill dielectric material layer and laterally adjacent to, and in direct physical contact with, the gate polysilicon layer.

Referring now to FIG. 24, there is illustrated the exemplary structure shown in FIG. 23 after forming a gate metal layer 68 on the recessed gap fill dielectric material layer 66 and laterally adjacent to, and in direct physical contact with, the gate polysilicon layer 64; the gate metal layer 68 also is in direct physical contact with end walls of the gate dielectric material layer 62 as is shown, for example, in FIG. 24. The gate metal layer 68 can include one of the WFMs or the optional conductive metal mentioned above for the gate electrode present in the gate structure material layer 24L. The gate metal layer 68 can be formed by a deposition process such as, for example, CVD, PECVD, sputtering or plating. An etch back process can follow the deposition of the gate metal material that provides the gate metal layer 68.

Figure 25:
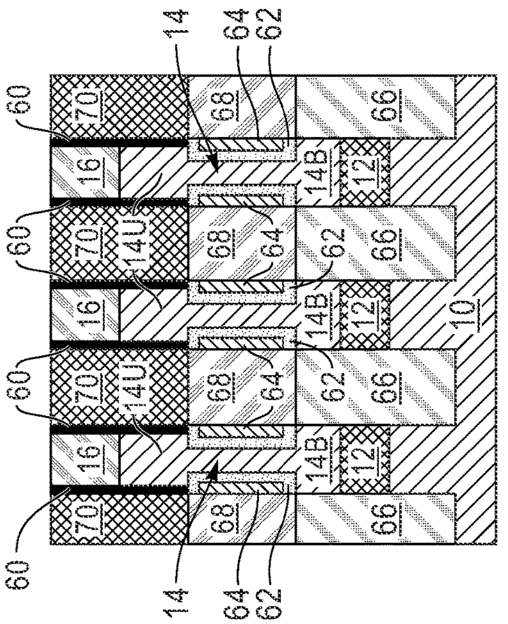
FIG. 25 is a cross sectional view of the exemplary structure shown in FIG. 24 after forming a first frontside ILD material layer.

Referring now to FIG. 25, there is illustrated the exemplary structure shown in FIG. 24 after forming a first frontside ILD material layer 70. The first frontside ILD material layer 70 is composed of one of the dielectric materials mentioned above for the first frontside ILD material layer 26 of the first embodiment of the present application. The first frontside ILD material layer 70 can be formed by utilizing a deposition process including one of the deposition processes mentioned above in forming the first frontside ILD material layer 26 of the first embodiment of the present application. A planarization process can follow the deposition of the dielectric material that provides the first frontside ILD material layer 70. At this junction of the present application, the first frontside ILD material layer 70 has a topmost surface that is coplanar with a topmost surface of dielectric spacer 60 and a topmost surface of the hard mask caps 16.

Figure 26:
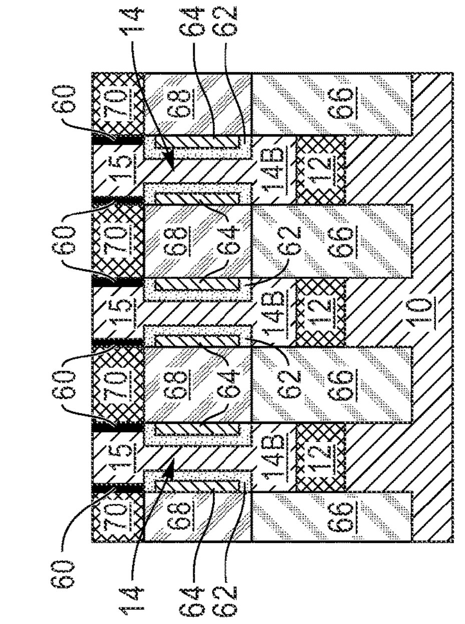
FIG. 26 is a cross sectional view of the exemplary structure shown in FIG. 25 after converting each upper mesa portion of the semiconductor material layer into a first source/drain region.

Referring now to FIG. 26, there is illustrated the exemplary structure shown in FIG. 25 after converting each upper mesa portion 14U of the semiconductor material layer 14L into a first source/drain region 15. Prior to this converting, each hard mask cap 16 is removed from the structure utilizing material removal process such as, for example, a planarization process (CMP and/or grinding). During the planarization process an upper portion of both the dielectric spacer 60 and the first frontside ILD material layer 70 can be removed together with each hard mask cap 16 so as to physically expose the upper mesa portion 14U. The converting of the upper mesa portions 14U into first source/drain regions 15 comprises introducing a dopant (n-type or p-type as mentioned above) into the physically exposed upper mesa portions 14U. Introducing the dopant can include one of ion implantation, gas phase doping or diffusion of dopant from a dopant source material. The concentration of dopant that is introduced into each upper mesa portion 14U is within the dopant range mentioned above in forming the first source/drain regions 32 of the first embodiment of the present application.

Figure 27:
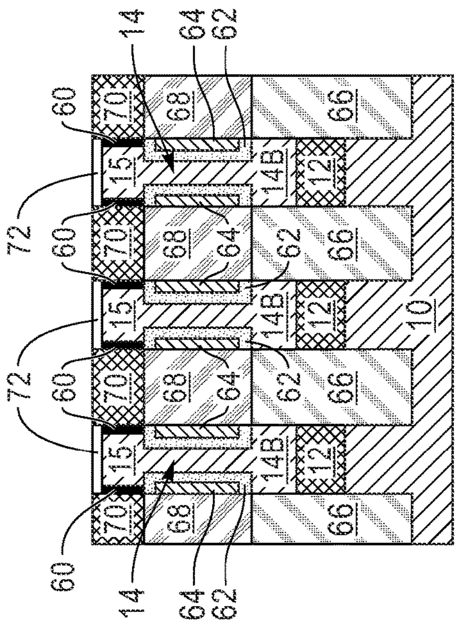
FIG. 27 is a cross sectional view of the exemplary structure shown in FIG. 26 after forming a frontside source/drain contact structure on each first source/drain region.

Referring now to FIG. 27 is a cross sectional view of the exemplary structure shown in FIG. 26 after forming a frontside source/drain contact structure 72 on each first source/drain region 15. The frontside source/drain contact structures 72 include any of the materials such as, for example, the contact conductor material, mentioned above for the frontside contact structures 36 in the previous embodiment of the present application. In the illustrated embodiment shown in FIG. 27, the frontside source/drain contact structure 72 can be formed by recessing (i.e., etching) an upper portion of each first source/drain region 15 and then forming the frontside source/drain contact structure 72 in the recessed area. In some embodiments (not shown), the frontside source/drain contact structure 72 can be formed on a non-recessed surface of each first source/drain region 15 by deposition and etching.

Figure 28:
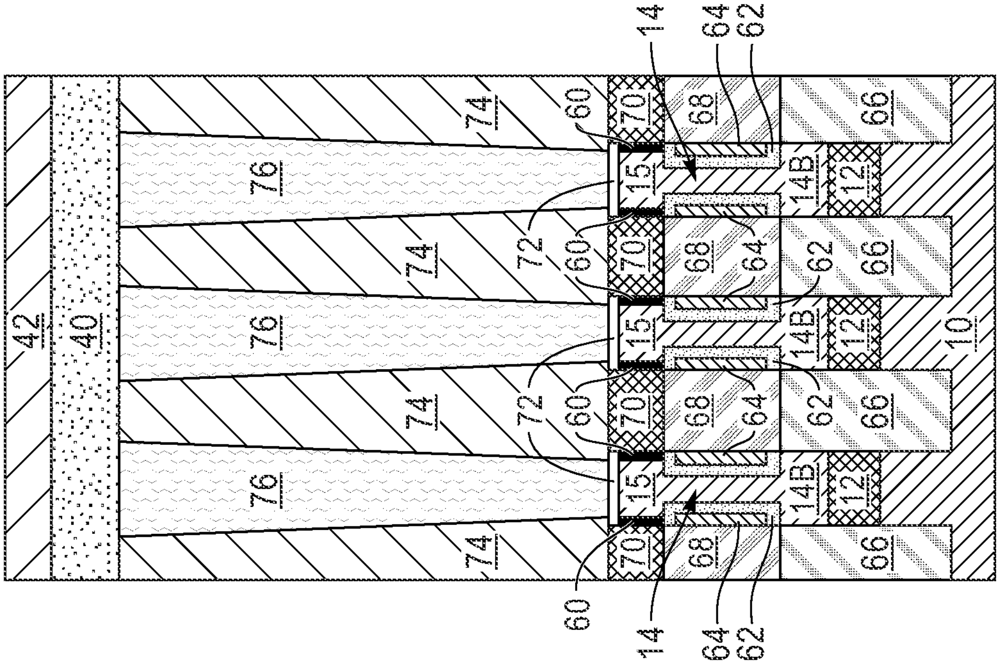
FIG. 28 is a cross sectional view of the exemplary structure shown in FIG. 27 after forming a second frontside ILD material layer, the second frontside ILD material layer including a plurality of DRAM capacitors embedded therein, wherein each DRAM capacitor extends entirely through the second frontside ILD material layer and is in direct contact with one of the frontside source/drain contact structures, and forming a frontside BEOL structure and a carrier wafer on the second frontside ILD material layer.

Referring now to FIG. 28, there is illustrated the exemplary structure shown in FIG. 27 after forming a second frontside ILD material layer 74, the second frontside ILD material layer 74 including a plurality of DRAM capacitors 76 embedded therein, wherein each DRAM capacitor 76 extends entirely through the second frontside ILD material layer 74 and is in direct contact with one of the frontside source/drain contact structures 72, and forming a frontside BEOL structure 40 and a carrier wafer 42 on the second frontside ILD material layer 74. In this embodiment, the DRAM capacitors 76 contact the frontside BEOL structure 40.

The second frontside ILD material layer 74 can include one of the dielectric materials mentioned above for the first frontside ILD material layer 26 of the first embodiment of the present application. The second frontside ILD material layer 74 can include a compositionally same, or compositionally different, dielectric maternal than the first frontside ILD material layer 70. The second frontside ILD material layer 74 can be formed by utilizing a deposition process including one of the deposition processes mentioned above in forming the first frontside ILD material layer 26 of the first embodiment of the present application.

DRAM capacitors 76 are then formed into the second frontside dielectric material layer 74 by first forming capacitor openings into the second frontside dielectric material layer 74 by lithography and etching. Each capacitor opening is then filled with materials that provide a capacitor e.g., first conductive plate material, dielectric material, and second conductive plate material as mentioned above for DRAM capacitors 38 in the previous embodiment of the present application. The filling can include deposition of the various materials followed by a planarization process. DRAM capacitors 76 can be referred to as trench capacitors.

The frontside BEOL structure 40 of this embodiment includes one or more interconnect dielectric material layers that contain one or more wiring regions embedded therein. The frontside BEOL structure 40 can be formed utilizing BEOL processing techniques that are well known to those skilled in the art. The carrier wafer 42 of this embodiment is the same as described in the previous embodiment of the present application. Carrier wafer 42 can be bonded to the frontside BEOL structure 40.

Figure 29:
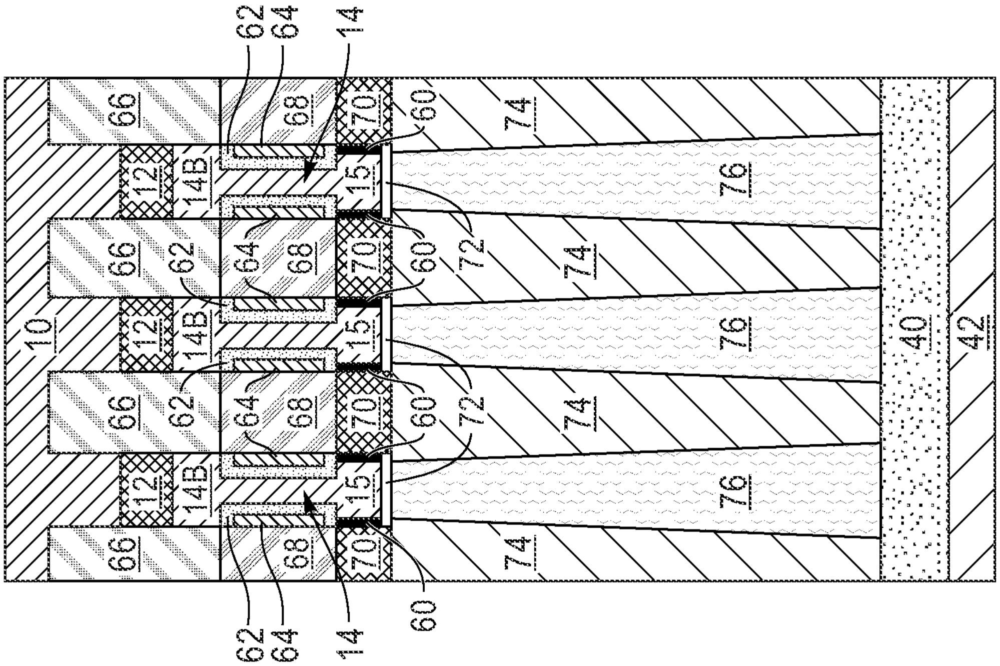
FIG. 29 is a cross sectional view of the exemplary structure shown in FIG. 28 after flipping the structure 180° to physically expose the remaining base semiconductor substrate.

Referring now to FIG. 29, there is illustrated the exemplary structure shown in FIG. 28 after flipping the structure 180° to physically expose the remaining base semiconductor substrate 10. This flipping will allow back side processing of the exemplary structure. In the present application, the structure is flipped 180°. Flipping of the structure can be performed by hand or by utilizing a mechanical means such as, for example, a robot arm.

Figure 30:
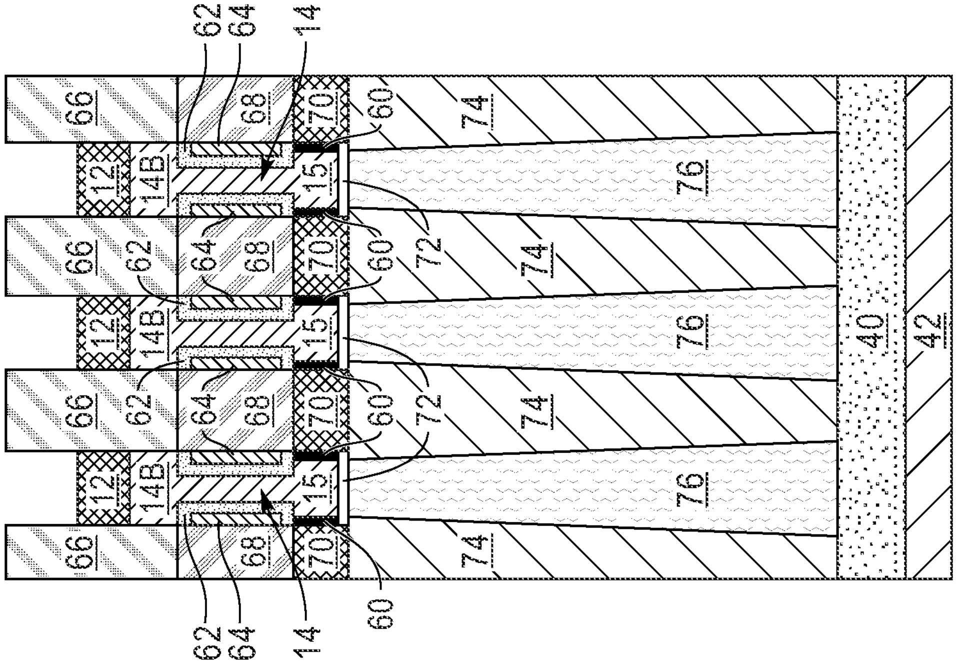
FIG. 30 is a cross sectional view of the exemplary structure shown in FIG. 29 after removing the physically exposed remaining portion of the base semiconductor substrate to physically expose at least a remaining portion of the etch stop layer.

Referring now to FIG. 30, there is illustrated the exemplary structure shown in FIG. 29 after removing the physically exposed remaining portion of the base semiconductor substrate 10 to physically expose at least a remaining portion of the etch stop layer 12, the gap fill dielectric material layer 66 is also physically exposed after removal of the remaining portion of the base semiconductor substrate 10. The remaining portion of the base semiconductor substrate 10 can be removed utilizing an etching process that is selective in removing the base semiconductor substrate 10.

Figure 31:
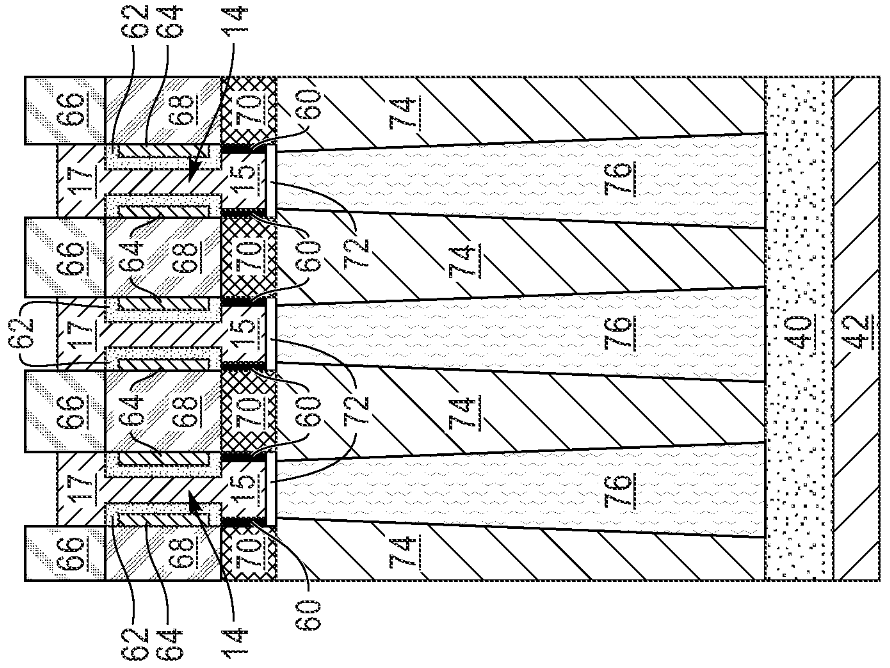
FIG. 31 is a cross sectional view of the exemplary structure shown in FIG. 30 after removing the physically exposed remaining portion of the etch stop layer so as to physically expose each bottom mesa portion of the semiconductor material layer, and converting each physically exposed bottom mesa portion of the semiconductor material layer to a second source/drain region.

Referring now to FIG. 31, there is illustrated the exemplary structure shown in FIG. 30 after removing the physically exposed remaining portion of the etch stop layer 12 so as to physically expose each bottom mesa portion 14B of the semiconductor material layer 14L, and converting each physically exposed bottom mesa portion 14B to a second source/drain region 17. The removal of the physically exposed remaining portion of the etch stop layer 12 includes a selective etching process. The converting of the bottom mesa portion 14B into second source/drain region 17 is the same as the converting of the upper mesa portions 14A into the first source/drain regions 15. In this embodiment, the first source/drain region 15, the vertical semiconductor material channel structure 14 and the second source/drain region 16 are of unitary construction (i.e., a single work piece) and are composed of a same semiconductor material. In this embodiment, the VFET includes the vertical semiconductor material channel structure 14, the first source/drain region 15 located at a first end of the vertical semiconductor material channel structure 14, the second source/drain region 17 located at a second end (opposite the first end) of the vertical semiconductor material channel structure 14, and a gate structure that includes gate dielectric material layer 62, the gate polysilicon layer 64 and the gate metal layer 68. In this embodiment, the first source/drain region 15 and the second source/drain region 17 have a faceted surface for connecting with the frontside and the backside, respectively.

Figure 32:
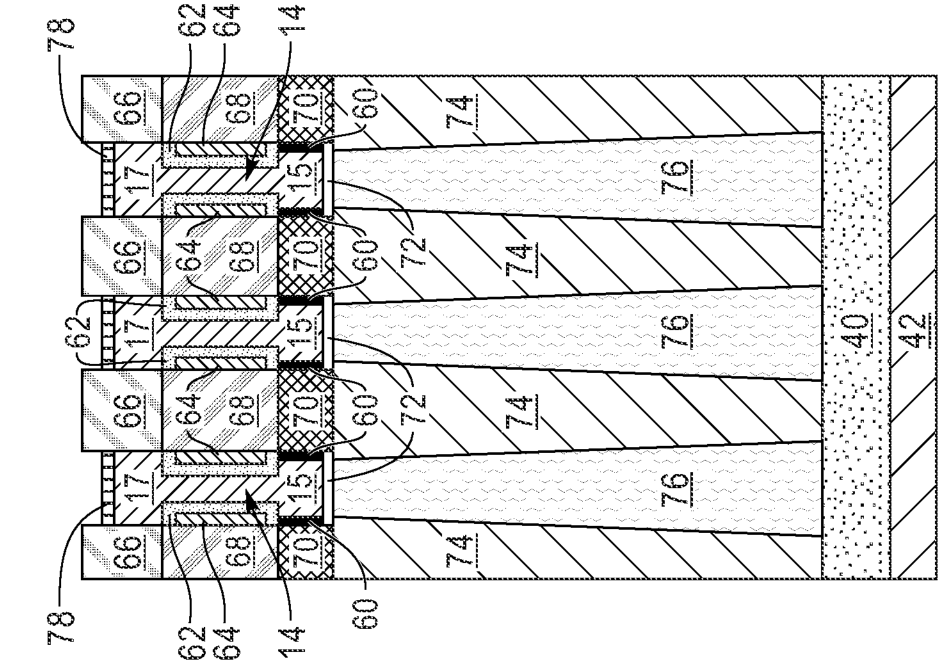
FIG. 32 is a cross sectional view of the exemplary structure shown in FIG. 31 after forming a backside source/drain contact structure on each second source/drain region.

Referring now to FIG. 32, there is illustrated the exemplary structure shown in FIG. 31 after forming a backside source/drain contact structure 78 on each second source/drain region 17. The backside source/drain contact structures 78 include materials as mentioned above for the frontside source/drain contact structures 36. In the illustrated embodiment shown in FIG. 32, the backside source/drain contact structure 78 can be formed by recessing (i.e., etching) an upper portion of each second source/drain region 17 and then forming the backside source/drain contact structure 78 in the recessed area. In some embodiments (not shown), the backside source/drain contact structure 78 can be formed on a non-recessed surface of each second source/drain region 17 by deposition and etching.

Figure 33:
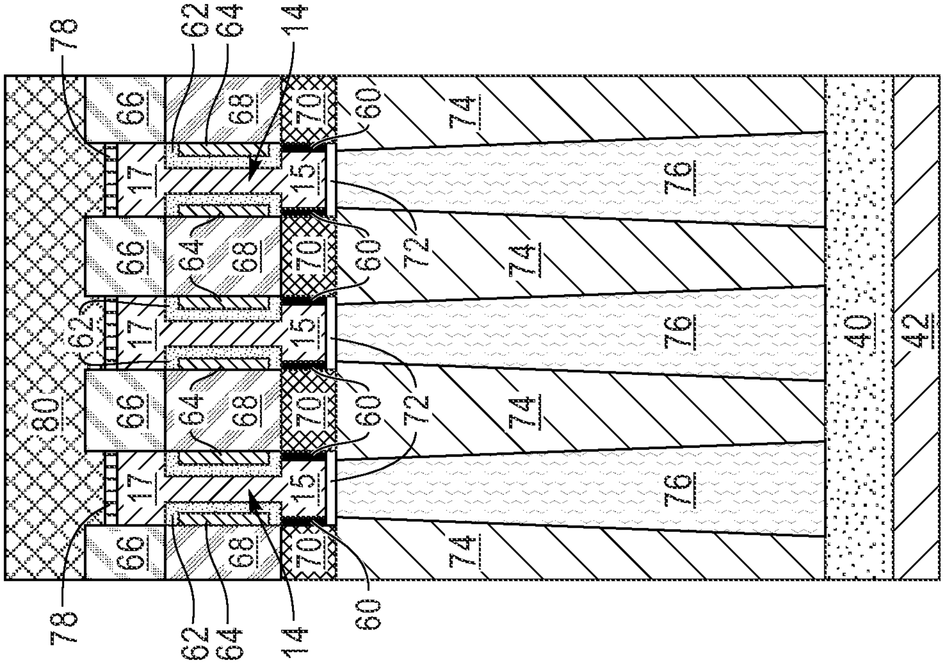
FIG. 33 is a cross sectional view of the exemplary structure shown in FIG. 32 after forming a backside ILD material layer.

Referring now to FIG. 33, there is illustrated the exemplary structure shown in FIG. 32 after forming a backside ILD material layer 80. The backside ILD material layer 80 can include one of dielectric materials mentioned above for the first frontside ILD material layer 26 of the previous embodiment of the present application. The backside ILD material layer 80 can be formed utilizing one of the deposition processes mentioned above in forming the first frontside ILD material layer 26 of the previous embodiment of the present application.

Figure 34:
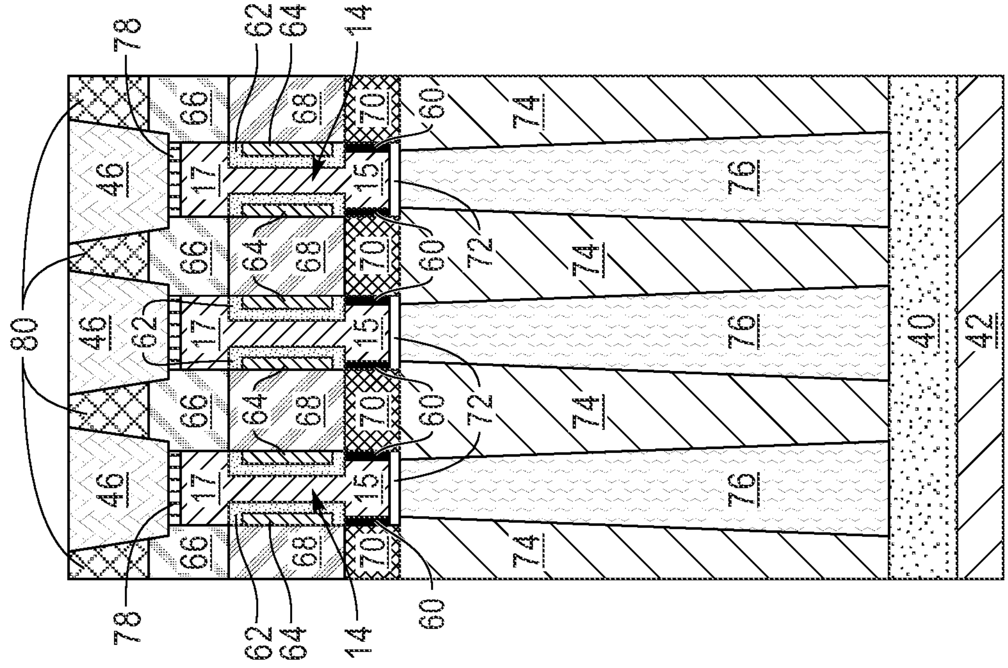
FIG. 34 is a cross sectional view of the exemplary structure shown in FIG. 33 after forming bitlines in the backside ILD material layer, wherein each bitline extends entirely through the backside ILD material layer and is in direct physical contact with one of the backside source/drain contact structures.

Referring now to FIG. 34, there is illustrated the exemplary structure shown in FIG. 33 after forming bitlines 46 in the backside ILD material layer 80, wherein each bitline 46 extends entirely through the backside ILD material layer 80 and is in direct physical contact with one of the backside source/drain contact structures 78. Bitlines 46 of this embodiment include any electrically conductive metal-containing material as mentioned in the first embodiment of the present application, and the bitlines 46 of this embodiment can be formed utilizing the technique mentioned above for forming the bitlines in the previous embodiment of the present application.

Figure 35:
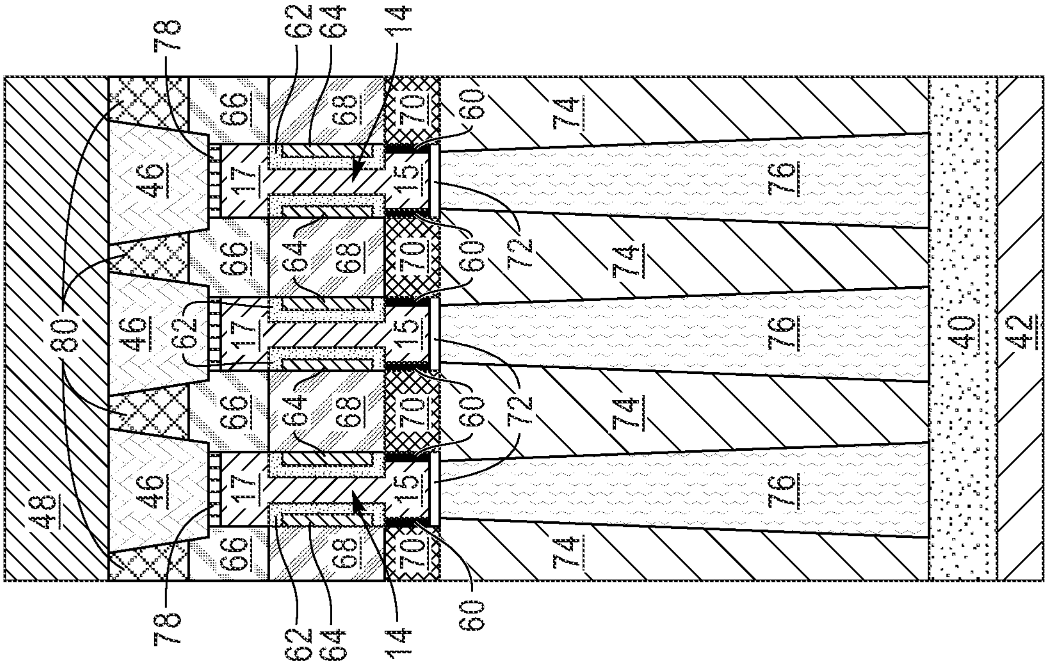
FIG. 35 is a cross sectional view of the exemplary structure shown in FIG. 34 after forming a backside BEOL structure on the backside ILD material layer.

Referring now to FIG. 35, there is illustrated the exemplary structure shown in FIG. 34 after forming a backside BEOL structure 48 on the backside ILD material layer 80 and on top of each bitline 46. The backside BEOL structure 48 of this embodiment is the same as the backside BEOL structure 48 in the previous embodiment; note the interconnect dielectric material layers and various wiring layers are not shown in the backside BEOL structure 48 shown in FIG. 35.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a dynamic random access memory (DRAM) cell comprising a plurality of field effect transistors (FETs) and a plurality of DRAM capacitors; and at least one bitline composed of an electrically conductive metal-containing material located on a backside of the DRAM cell, wherein the at least one bitline has a first surface in contact with a source/drain region of each FET of the plurality of FETs, and a second surface, opposite the first surface that is direct physical contact with a backside power distribution network; a shallow trench isolation structure located adjacent the source/drain region in contact with the first surface of the at least one bitline, wherein the first surface of the bitline extends onto, and is in contact with, the shallow trench isolation structure.

2. The semiconductor structure of claim 1, wherein the DRAM cell has a unit cell area defined as $4F^2$, wherein F is equal to a gate half pitch.

3. The semiconductor structure of claim 1, wherein each DRAM capacitor of the plurality of DRAM capacitors is a stacked capacitor.

4. The semiconductor structure of claim 1, wherein each FET of the plurality of FETs is a vertical FET comprising a vertical semiconductor channel material structure, a gate structure located on each side of the vertical semiconductor channel material structure, a first source/drain region located at a first end of the vertical semiconductor channel material structure and a second source/drain region located at a second end of the vertical semiconductor channel material structure which is opposite the first end of the vertical semiconductor channel material structure, wherein the second source/drain region of the vertical FET is in contact with the backside bitline.

5. The semiconductor structure of claim 4, wherein the vertical semiconductor channel material structure, the first source/drain region and the second source/drain region are of unitary construction and are composed of a same semiconductor material.

6. The semiconductor structure of claim 4, further comprising:

a frontside source/drain contact structure contacting the first source/drain region, and connecting the first source/drain region to one DRAM capacitor of the plurality of DRAM capacitors.

7. The semiconductor structure of claim 6, wherein the at least one bitline is in direct contact with the second source/drain region.

8. The semiconductor structure of claim 6, wherein the at least one bitline is in direct contact with a backside source/drain contact structure that is located on the second source/drain region.

9. The semiconductor structure of claim 4, wherein both the first source/drain region and the second source/drain region have a non-faceted surface, the non-faceted surface is opposite a surface of the first source/drain region and the second source/drain region that contacts the vertical semiconductor channel material structure.

10. The semiconductor structure of claim 4, further comprising:

a dielectric spacer located along a sidewall of the first source/drain region.

11. The semiconductor structure of claim 1, wherein each DRAM capacitor of the plurality of DRAM capacitors is embedded in a frontside back-end-of-the-line (BEOL) structure.

12. The semiconductor structure of claim 11, further comprising:

a carrier wafer located on the frontside back-end-of-the-line (BEOL) structure.

13. The semiconductor structure of claim 12, wherein the carrier wafer is spaced apart from each DRAM capacitor of the plurality of DRAM capacitors by a portion of the frontside BEOL structure.

14. The semiconductor structure of claim 1, wherein each DRAM capacitor of the plurality of DRAM capacitors is present in a frontside interlayer dielectric material layer.

15. The semiconductor structure of claim 14, wherein each DRAM capacitor extends entirely through the frontside interlayer dielectric material layer.

16. The semiconductor structure of claim 15, further comprising:

a carrier wafer located on the frontside interlayer dielectric material layer.

17. The semiconductor structure of claim 1, wherein each FET comprises a gate structure located on each side of a vertical semiconductor channel material structure, wherein the gate structure comprises a gate dielectric material layer in direct contact with a sidewall of the vertical semiconductor channel material structure, and a gate electrode located laterally adjacent to the gate dielectric material layer, wherein the gate electrode comprises at least a work function metal layer.

18. The semiconductor structure of claim 17, further comprising:

a gate polysilicon layer positioned between the gate dielectric material layer and the gate electrode.

19. The semiconductor structure of claim 17, further comprising:

a first dielectric spacer located on a surface of the gate structure and contacting the sidewall of the vertical semiconductor channel material structure, and a second dielectric spacer located on another surface of the gate structure and contacting the sidewall of the vertical semiconductor channel material structure.

* * * * *